(12) United States Patent
Sirinorakul et al.

(10) Patent No.: US 9,349,679 B2
(45) Date of Patent: May 24, 2016

(54) SINGULATION METHOD FOR SEMICONDUCTOR PACKAGE WITH PLATING ON SIDE OF CONNECTORS

(75) Inventors: Saravuth Sirinorakul, Bangkok (TH); Somchai Nondhasitthichai, Bangkok (TH)

(73) Assignee: UTAC THAI LIMITED, Bangkok (TH)

( * ) Notice: Subject to any disclaimer, the term of this patent is extended or adjusted under 35 U.S.C. 154(b) by 662 days.

(21) Appl. No.: 13/214,106

(22) Filed: Aug. 19, 2011

(65) Prior Publication Data

US 2012/0049335 A1 Mar. 1, 2012

Related U.S. Application Data

(60) Provisional application No. 61/378,776, filed on Aug. 31, 2010, provisional application No. 61/412,183, filed on Nov. 10, 2010.

(51) Int. Cl.
*H01L 21/78* (2006.01)
*H01L 23/495* (2006.01)
(Continued)

(52) U.S. Cl.
CPC ........ *H01L 23/49582* (2013.01); *H01L 21/561* (2013.01); *H01L 24/97* (2013.01); *H01L 23/49548* (2013.01); *H01L 24/45* (2013.01); *H01L 24/48* (2013.01); *H01L 24/73* (2013.01); *H01L 2221/68331* (2013.01); *H01L 2224/32245* (2013.01); *H01L 2224/45124* (2013.01); *H01L 2224/45144* (2013.01); *H01L 2224/45147* (2013.01); *H01L 2224/48091* (2013.01); *H01L 2224/48247* (2013.01); *H01L 2224/48257* (2013.01); *H01L 2224/73265* (2013.01); *H01L 2224/83192* (2013.01); *H01L 2224/92247* (2013.01); *H01L 2224/97* (2013.01);
(Continued)

(58) Field of Classification Search
CPC .. H01L 21/561; H01L 23/49582; H01L 24/97
USPC ............ 257/676, E23.052, E21.599; 438/113
See application file for complete search history.

(56) References Cited

U.S. PATENT DOCUMENTS 3,169,923 A 2/1965 Latos et al.
3,203,895 A 8/1965 Guarnaccio et al.
(Continued)

OTHER PUBLICATIONS

Office Action dated Aug. 16, 2012, U.S. Appl. No. 12/290,188, filed Oct. 27, 2008, Saravuth Sirinorakul.
(Continued)

*Primary Examiner* — Walter H Swanson
(74) *Attorney, Agent, or Firm* — Haverstock & Owens LLP

(57) ABSTRACT

A method of singulating semiconductor packages, the method comprising: providing a plurality of semiconductor dies coupled to a single common leadframe, wherein a molding compound at least partially encases the semiconductor dies and the leadframe; singulating the plurality of semiconductor dies, wherein the leadframe is at least partially cut between adjacent semiconductor dies, thereby forming exposed side surfaces on leads of the leadframe; and plating the exposed side surfaces of the leads with a plating material, wherein the plating material is a different material than the leads. In some embodiments, singulating the plurality of semiconductor dies comprises performing a full cut of the leadframe. In some embodiments, singulating the plurality of semiconductor dies comprises performing separate partial cuts of the leadframe.

19 Claims, 19 Drawing Sheets

(51) Int. Cl.
*H01L 21/56* (2006.01)
*H01L 23/00* (2006.01)

(52) U.S. Cl.
CPC . *H01L2924/014* (2013.01); *H01L 2924/01005* (2013.01); *H01L 2924/01013* (2013.01); *H01L 2924/01028* (2013.01); *H01L 2924/01029* (2013.01); *H01L 2924/01033* (2013.01); *H01L 2924/01047* (2013.01); *H01L 2924/01079* (2013.01); *H01L 2924/01082* (2013.01); *H01L 2924/15313* (2013.01); *H01L 2924/181* (2013.01)

(56) References Cited

U.S. PATENT DOCUMENTS

| | | | |
|---|---|---|---|
| 3,750,847 A | 8/1973 | Sluhan | |
| 3,877,682 A | 4/1975 | Moss | |
| 4,419,234 A | 12/1983 | Miller et al. | |
| 4,484,417 A | 11/1984 | Klingerman | |
| 4,772,402 A | 9/1988 | Love | |
| 4,782,591 A | 11/1988 | DeVito et al. | |
| 5,048,599 A | 9/1991 | Tustaniwskyj et al. | |
| 5,244,586 A | 9/1993 | Hawkins et al. | |
| 5,372,220 A | 12/1994 | Jacobs et al. | |
| 5,494,134 A | 2/1996 | McConkey | |
| 5,578,529 A | 11/1996 | Mullins | |
| 5,832,585 A | 11/1998 | Takiar et al. | |
| 5,923,995 A | 7/1999 | Kao et al. | |
| 6,006,736 A | 12/1999 | Suzuki et al. | |
| 6,139,406 A | 10/2000 | Kennedy et al. | |
| 6,225,798 B1 | 5/2001 | Omishi et al. | |
| 6,386,948 B1 | 5/2002 | Kondo | |
| 6,414,385 B1 | 7/2002 | Huang et al. | |
| 6,416,587 B1 | 7/2002 | Lu et al. | |
| 6,428,883 B1 | 8/2002 | White | |
| 6,451,709 B1 | 9/2002 | Hembree | |
| 6,488,416 B1 | 12/2002 | Shishikura et al. | |
| 6,508,944 B1 | 1/2003 | Bratten | |
| 6,521,513 B1 | 2/2003 | Lebens et al. | |
| 6,655,245 B2 | 12/2003 | Schuettel | |
| 6,660,626 B1 * | 12/2003 | Lin | 438/618 |
| 6,669,538 B2 | 12/2003 | Li et al. | |
| 6,743,076 B2 | 6/2004 | Adachi et al. | |
| 6,800,859 B1 | 10/2004 | Shishido et al. | |
| 6,902,469 B2 | 6/2005 | Kondo et al. | |
| 6,938,633 B2 | 9/2005 | Sugata et al. | |
| 7,014,552 B1 | 3/2006 | Collier et al. | |
| 7,021,999 B2 | 4/2006 | Jiang et al. | |
| 7,281,535 B2 | 10/2007 | Mihai et al. | |
| 7,456,963 B2 | 11/2008 | Shishido et al. | |
| 7,791,725 B2 | 9/2010 | Shishido et al. | |
| 7,994,804 B2 | 8/2011 | Miya et al. | |
| 8,027,800 B2 | 9/2011 | Nachman et al. | |
| 2004/0196464 A1 | 10/2004 | Akutsu et al. | |
| 2005/0056135 A1 | 3/2005 | Hall et al. | |
| 2005/0202575 A1 | 9/2005 | Usui et al. | |
| 2005/0268899 A1 | 12/2005 | Mihia et al. | |
| 2006/0097366 A1 * | 5/2006 | Sirinorakul et al. | 257/666 |
| 2007/0052076 A1 * | 3/2007 | Ramos et al. | 257/676 |
| 2007/0175304 A1 | 8/2007 | In't Veld et al. | |
| 2009/0223942 A1 * | 9/2009 | Heyl | 219/121.69 |
| 2009/0224402 A1 * | 9/2009 | Do et al. | 257/738 |
| 2011/0244629 A1 * | 10/2011 | Gong | H01L 21/4828 438/112 |

OTHER PUBLICATIONS

Advisory Action dated Jun. 20, 2012, U.S. Appl. No. 13/304,590, filed Nov. 25, 2011, Saravuth Sirinorakul et al.
Notice of Publication, dated Mar. 22, 2012, U.S. Appl. No. 13/304,950, filed Nov. 25, 2011, Saravuth Sirinorakul.
Office Action dated Oct. 3, 2012, U.S. Appl. No. 12/070,191, filed Feb. 14, 2008, Sorasak Utahin et al.
Office Action dated Oct. 3, 2012, U.S. Appl. No. 13/235,124, filed Sep. 16, 2011, Sorasak Utahin et al.

* cited by examiner

US 9,349,679 B2

SINGULATION METHOD FOR SEMICONDUCTOR PACKAGE WITH PLATING ON SIDE OF CONNECTORS

CROSS-REFERENCE TO RELATED APPLICATIONS

This application claims priority to U.S. Provisional Application Ser. No. 61/378,776, filed Aug. 31, 2010, entitled "SINGULATION METHOD FOR SEMICONDUCTOR PACKAGE WITH PLATING ON SIDE OF CONNECTORS" and to U.S. Provisional Application Ser. No. 61/412,183, filed Nov. 10, 2010, entitled "SINGULATION AND PLATING METHOD FOR SEMICONDUCTOR PACKAGE," both of which are hereby incorporated by reference in their entirety as if set forth herein.

FIELD OF THE INVENTION

The present invention relates to the field of semiconductor packages. More specifically, the present invention relates to a singulation and plating method for semiconductor packages.

BACKGROUND OF THE INVENTION

FIG. 1 is a perspective view of a prior art semiconductor package 100 having a top surface 110a and side surfaces 110b formed by a molding compound. A leadframe is encased in the molding compound, with the top surfaces 120a and side surfaces 120b of its leads being exposed. The region 130 of the leadframe corresponding to the die attach pad of the leadframe is also exposed. As seen in FIG. 1, although the top surfaces 120a and region 130 might be plated with a plating material, the sides 120b of the leads, or connectors, in a conventional package 100 are not plated. As a result of the side surfaces 120b of the leads not being plated, their exposed surface, typically copper, is easy to react with oxygen, thereby resulting in undesirable oxide on the surface of the leads. The contaminated surface will create problems when the semiconductor package 100 is soldered into a printed circuit board.

SUMMARY OF THE INVENTION

The present invention provides a new, useful, and non-obvious method of singulating and plating semiconductor packages, employing plating of the side surfaces of the leads of the leadframe in order to prevent contamination of the lead surfaces.

In one aspect of the present invention, a method of singulating semiconductor packages comprises: providing a plurality of semiconductor dies coupled to a single common leadframe, wherein a molding compound at least partially encases the semiconductor dies and the leadframe; singulating the plurality of semiconductor dies, wherein the leadframe is at least partially cut between adjacent semiconductor dies, thereby forming exposed side surfaces on leads of the leadframe; and plating the exposed side surfaces of the leads with a plating material, wherein the plating material is a different material than the leads.

In some embodiments, the leads are copper. In some embodiments, the plating material is a metallic material. In some embodiments, the plating material is tin, silver, gold, nickel-gold, nickel-palladium, or nickel-palladium-gold.

In some embodiments, the leadframe has a top surface and a bottom surface opposite the top surface, and the step of singulating the plurality of semiconductor dies comprises performing a full cut of the leadframe in a single cutting operation before the step of plating the exposed side surfaces, wherein the full cut extends all the way between the top surface and the bottom surface. In some embodiments, the semiconductor dies are attached to the bottom surface of the leadframe, and the method further comprises plating the top surface of the leadframe before the step of singulating the plurality of semiconductor dies. In some embodiments, the semiconductor dies are attached to the bottom surface of the leadframe, and the method further comprises plating the top surface of the leadframe after the step of singulating the plurality of semiconductor dies.

In some embodiments, the leadframe has a top surface and a bottom surface opposite the top surface, and the step of singulating the plurality of semiconductor dies comprises: performing a first partial cut of the leadframe, wherein the first partial cut does not extend all the way between the bottom surface and the top surface; and performing a second partial cut of the leadframe, wherein the second partial cut is performed separately from the first partial cut and completes the singulation of the semiconductor dies all the way between the bottom surface and the top surface of the leadframe, thereby forming a plurality of singulated semiconductor packages. In some embodiments, the step of plating the exposed side surfaces is performed in between the first partial cut and the second partial cut. In some embodiments, the semiconductor dies are attached to the bottom surface of the leadframe, and the method further comprises plating the top surface of the leadframe, wherein the plating of the top surface is performed before the first partial cut. In some embodiments, the semiconductor dies are attached to the bottom surface of the leadframe, and the method further comprises plating the top surface of the leadframe, wherein the plating of the top surface is performed between the first partial cut and the second partial cut. In some embodiments, the first partial cut is performed using a blade having a first thickness and the second partial cut is performed using a blade having a second thickness, wherein the first thickness and the second thickness are different. In some embodiments, the second thickness is larger than the first thickness. In some embodiments, the second partial cut forms a step on sides of the singulated semiconductor packages. In some embodiments, the first partial cut or the second partial cut is performed using a blade having a beveled edge.

In some embodiments, the step of providing the plurality of semiconductor dies comprises: coupling the semiconductor dies to the single common leadframe; wire bonding the semiconductor dies to leads of the leadframe; and at least partially encasing the semiconductor dies and the leadframe in a molding compound.

In another aspect of the present invention, a singulated semiconductor package comprises: a leadframe having a die attach pad and a plurality of leads; a semiconductor die coupled to the die attach pad of the leadframe; and a molding compound at least partially encasing the leadframe and the semiconductor die, wherein side surfaces of the leads are exposed through the molding compound, and wherein the side surfaces of the leads are plated with a plating material, the plating material being a different material than the leads.

In some embodiments, the leads are copper. In some embodiments, the plating material is a metallic material. In some embodiments, the plating material is tin, silver, gold, nickel-gold, nickel-palladium, or nickel-palladium-gold.

In some embodiments, the mold compound comprises a top surface, a bottom surface, and side surfaces between the top surface and the bottom surface, wherein the side surfaces comprise a step. In some embodiments, the mold compound comprises a top surface, a bottom surface, and side surfaces between the top surface and the bottom surface, wherein the side surfaces comprise a beveled portion. In some embodiments, the mold compound comprises a top surface, a bottom surface, and side surfaces between the top surface and the bottom surface, wherein the side surfaces comprise a beveled portion and a non-beveled portion.

In some embodiments, the semiconductor die is wire bonded to the leads of the leadframe.

DETAILED DESCRIPTION OF THE INVENTION

The following description is presented to enable one of ordinary skill in the art to make and use the invention and is provided in the context of a patent application and its requirements. Various modifications to the described embodiments will be readily apparent to those skilled in the art and the generic principles herein may be applied to other embodiments. Thus, the present invention is not intended to be limited to the embodiment shown but is to be accorded the widest scope consistent with the principles and features described herein.

This disclosure provides several embodiments of the present invention. It is contemplated that any features from any embodiment can be combined with any features from any other embodiment. In this fashion, hybrid configurations of the disclosed embodiments are well within the scope of the present invention.

The present invention provides a new, useful, and non-obvious method of singulating and plating semiconductor packages, employing plating of the side surfaces of the leads of the leadframe in order to prevent contamination of the lead surfaces.

Figure 1:
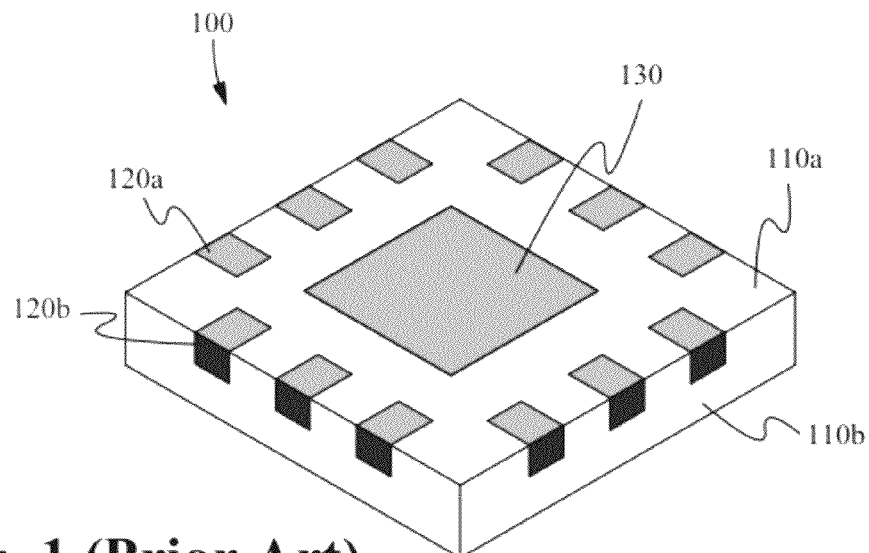
FIG. 1 is a perspective view of a prior art semiconductor package.
Figure 2:
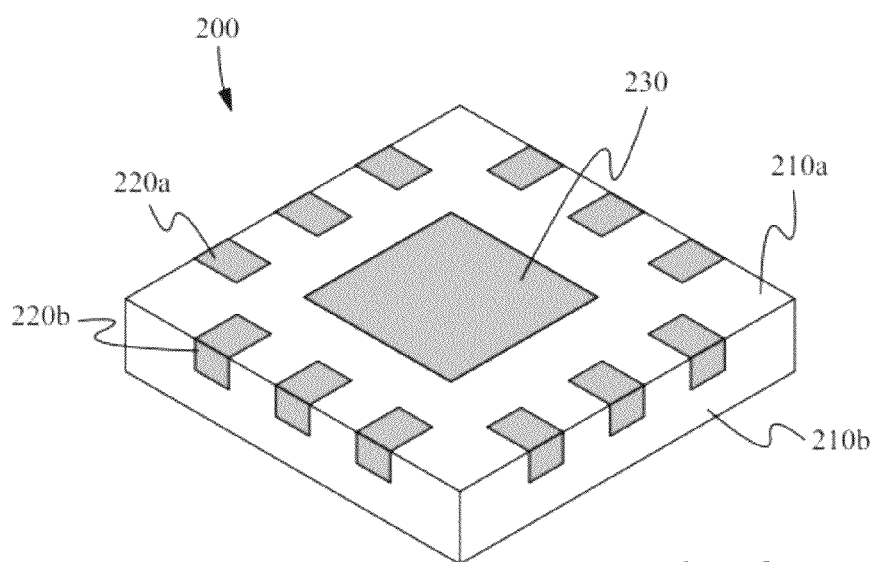
FIG. 2 is a perspective view of a semiconductor package in accordance with some embodiments of the present invention.

FIG. 2 is a perspective view of a semiconductor package 200 in accordance with some embodiments of the present invention. The semiconductor package 200 has a top surface 210a and side surfaces 210b preferably formed by a molding compound. A leadframe is encased in the molding compound, with the top surfaces 220a and side surfaces 220b of its leads being exposed. In some embodiments, the leads are copper. However, it is contemplated that other materials besides copper can be used to form the leads. In some embodiments, the region 230 of the leadframe corresponding to the die attach pad of the leadframe is also exposed.

As seen in FIG. 2, not only are the top surfaces 220a and region 230 plated with a plating material, but the sides 220b of the leads, or connectors, are plated with a plating material as well. In some embodiments, the plating material on the surfaces 220a, 220b, and 230 is a material configured not to react with oxygen. As a result, the plated surfaces have a good soldering result when the semiconductor package 200 is attached to a printed circuit board. In some embodiments, the plating material is a metallic material. In some embodiments, the plating material is tin. Other materials that can be used as the plating material include, but are not limited to, silver, gold, nickel-gold, nickel-palladium, and nickel-palladium-gold.

In a preferred embodiment, the sides of the leadframe connectors are plated after they are singulated in strip form. In some embodiments, the singulation processes of the present invention, such as those discussed below, involve taking a wafer containing multiple, preferably identical, semiconductor dies coupled to a leadframe, and reducing it into individual semiconductor packages each containing one of those dies. It is contemplated that the present invention can employ a variety of different plating processes and techniques in order to plate the surfaces of the leads. In some embodiments, the present invention can employ any of the plating processes and techniques disclosed in U.S. patent application Ser. No. 12/579,574, filed Oct. 15, 2009, and entitled "METALLIC SOLDERABILITY PRESERVATION COATING ON METAL PART OF SEMICONDUCTOR PACKAGE TO PREVENT OXIDE," which is hereby incorporated by reference in its entirety as if set forth herein It is noted that reference is made in this disclosure to "top" and "bottom" surfaces. The purpose of using the terms "top" and "bottom" with respect to the surfaces is to help identify these surfaces as being opposite one another and to help identify the "side" surfaces as being the surfaces between the "top" and "bottom" surfaces. Therefore, in certain portions of this disclosure, "top" surfaces can appear to be on the bottom and "bottom" surfaces can appear to be on the top if the positioning of the semiconductor package has been changed.

Figure 3A:
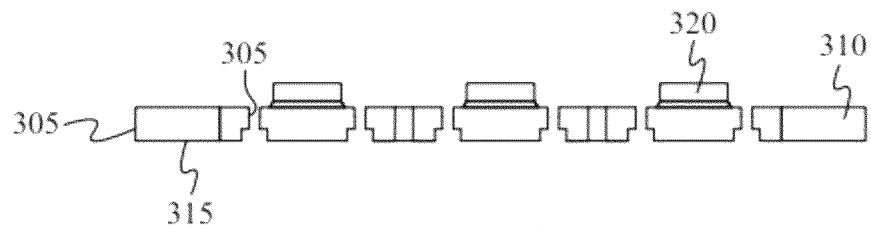
FIGS. 3A-H illustrate different stages of a singulation and plating process using full cutting in accordance with some embodiments of the present invention.
Figure 3B:
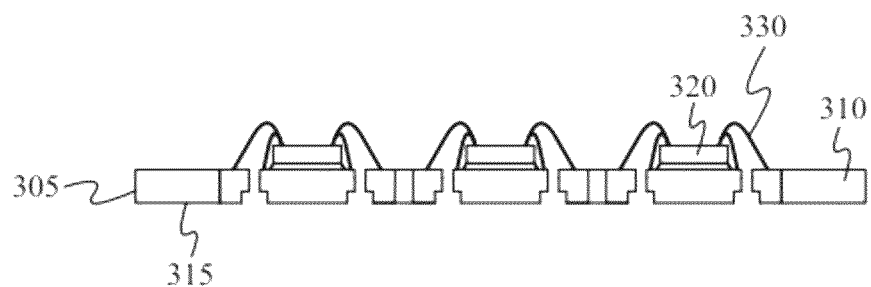
Figure 3C:
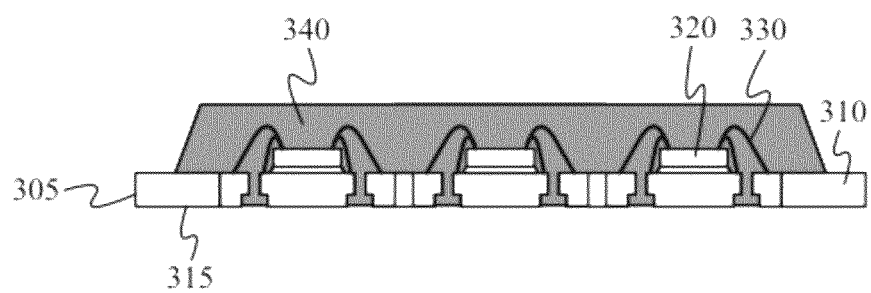

FIGS. 3A-H illustrate different stages of a singulation and plating process using full cutting in accordance with some embodiments of the present invention. In FIG. 3A, a plurality of semiconductor dies 320 are each coupled to a surface of the same leadframe 310 (e.g., a leadframe strip). In a preferred embodiment, each of the semiconductor dies 320 is attached to a die attach pad on the leadframe 310. The leadframe 310 comprises a side surface 305 that extends between a bottom surface 315 of the leadframe and the top surface of the leadframe (i.e., the surface to which the semiconductor dies are attached). It is contemplated that the semiconductor dies 320 can be coupled to the leadframe 310 in a variety of different ways, including, but not limited to, using soldering flux. In FIG. 3B, the semiconductor dies 320 are wire bonded to the leadframe 310 using wires 330. It is contemplated that a variety of different types of materials can be used to form the bonding wires 330, including, but not limited to, aluminum, copper, and gold. In FIG. 3C, a molding process is performed to encase the semiconductor dies 320, the leadframe 310, and the bonding wires 330 in a molding compound 340.

Figure 3D:
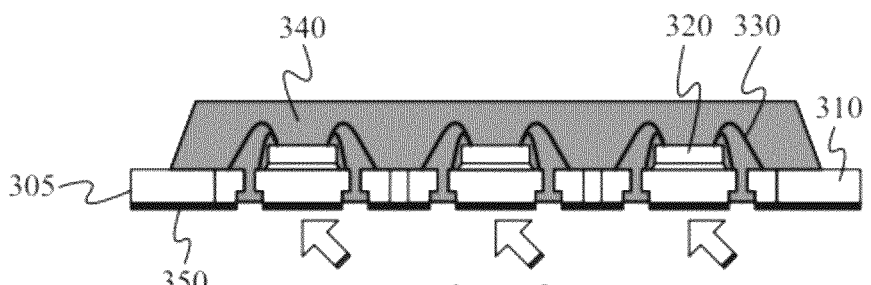

In FIG. 3D, a plating process is performed to plate the bottom surface 315 with a plating material 350. In a preferred embodiment, the plating material 350 is a material configured not to react with oxygen. In some embodiments, the plating material 350 is a metallic material. In some embodiments, the plating material 350 is tin. Other materials that can be used as the plating material 350 include, but are not limited to, silver, gold, nickel-gold, nickel-palladium, and nickel-palladium-gold.

Figure 3E:
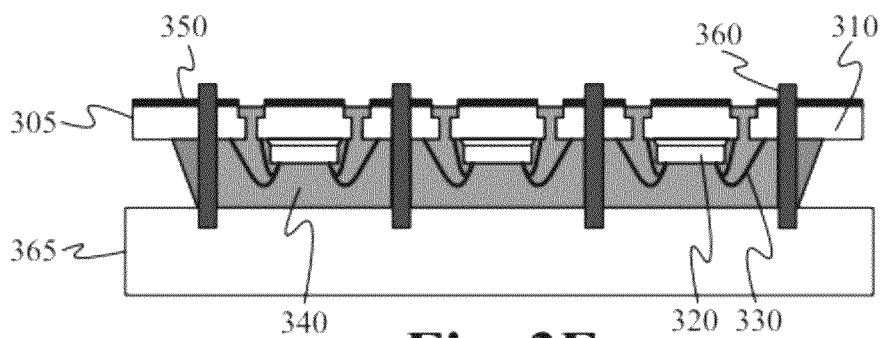

In FIG. 3E, a singulation process is performed on the leadframe strip 310. In a preferred embodiment, the leadframe strip 310 is placed on a support 365, and blades 360 are used to completely singulate the semiconductor packages in one full cutting operation. In some embodiments, as seen in FIG. 3E, the bottom surface 315 is facing upward during the full cutting operation. However, it is contemplated that the bottom surface 315 can be alternatively positioned, such as facing downwards, sideways, or at an angle.

Figure 3F:
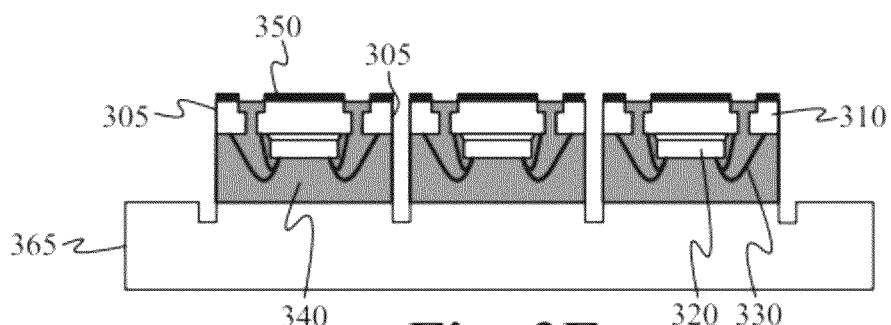
Figure 3G:
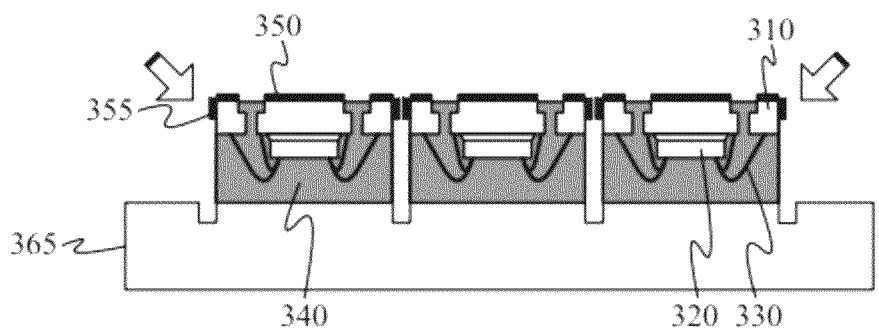

In FIG. 3F, the side surfaces 305 of the leads between neighboring semiconductor dies are exposed as a result of the singulation process. The singulated semiconductor packages can now be loaded to another plating process. In FIG. 3G, the exposed side surfaces 305 of the leads are plated with a plating material 355. As discussed above, the plating material 355 is preferably a material configured not to react with oxygen. In some embodiments, the plating material 355 is a metallic material. In some embodiments, the plating material 355 is tin. Other materials that can be used as the plating material 350 include, but are not limited to, silver, gold, and nickel-gold.

Figure 3H:
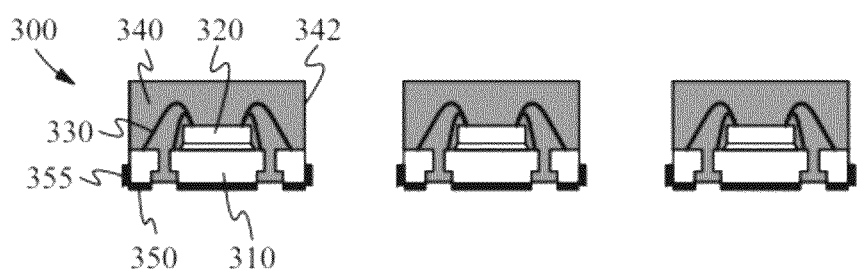

FIG. 3H shows the finished individual semiconductor packages 300, similar to the semiconductor package 200 in FIG. 2. Each semiconductor package 300 has a semiconductor die 320 and a leadframe 310 at least partially encased in the molding compound 340, with the leads of each leadframe 310 being accessible to electrical coupling via the plating material 350 and 355 over the portions of the leads that are exposed from the molding compound 340. Each semiconductor package 300 has side surfaces 342 that are formed from the molding compound 340. In some embodiments, the side surfaces 342 are straight from top to bottom, as shown in FIG. 3H.

Figure 4A:
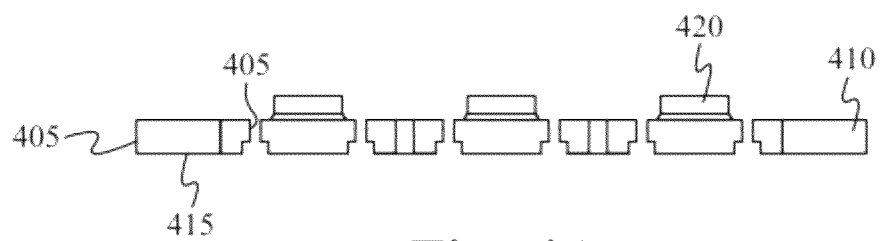
FIGS. 4A-G illustrate different stages of another singulation and plating process using full cutting in accordance with some embodiments of the present invention.
Figure 4B:
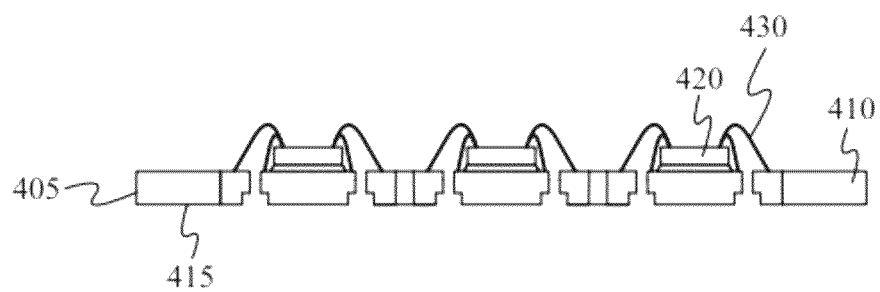
Figure 4C:
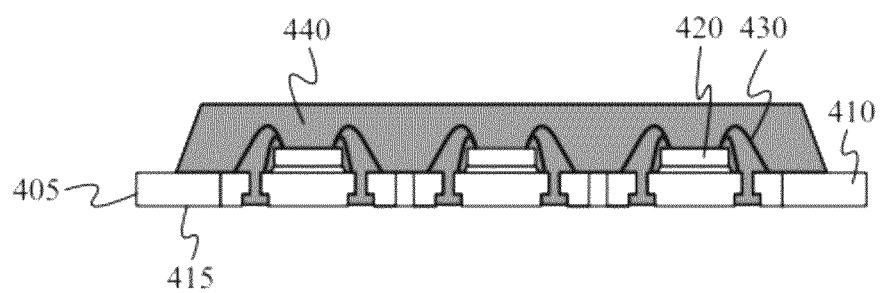

FIGS. 4A-G illustrate different stages of another singulation and plating process using full cutting in accordance with some embodiments of the present invention. In FIG. 4A, a plurality of semiconductor dies 420 are each coupled to a surface of the same leadframe 410 (e.g., a leadframe strip). In a preferred embodiment, each of the semiconductor dies 420 is attached to a die attach pad on the leadframe 410. The leadframe 410 comprises a side surface 405 that extends between a bottom surface 415 of the leadframe and the top surface of the leadframe (i.e., the surface to which the semiconductor dies are attached). It is contemplated that the semiconductor dies 420 can be coupled to the leadframe 410 in a variety of different ways, including, but not limited to, using soldering flux. In FIG. 4B, the semiconductor dies 420 are wire bonded to the leadframe 410 using wires 430. It is contemplated that a variety of different types of materials can be used to form the bonding wires 430, including, but not limited to, aluminum, copper, and gold. In FIG. 4C, a molding process is performed to encase the semiconductor dies 420, the leadframe 410, and the bonding wires 430 in a molding compound 440.

Figure 4D:
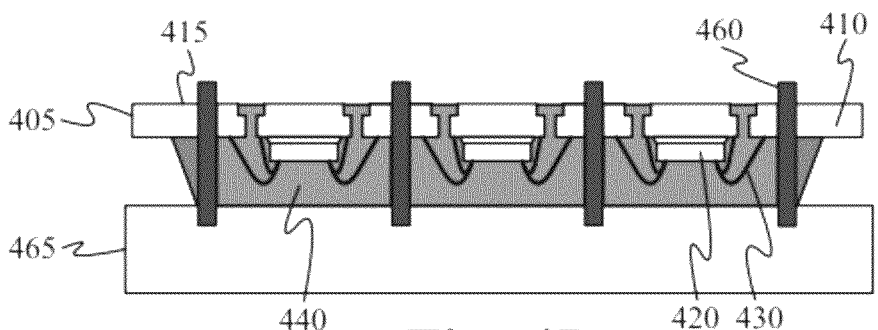

In FIG. 4D, a singulation process is performed on the leadframe strip 410. In a preferred embodiment, the leadframe strip 410 is placed on a support 465, and blades 460 are used to completely singulate the semiconductor packages in one full cutting operation. In some embodiments, as seen in FIG. 4D, the bottom surface 415 is facing upward during the full cutting operation. However, it is contemplated that the bottom surface 415 can be alternatively positioned, such as facing downwards, sideways, or at an angle.

Figure 4E:
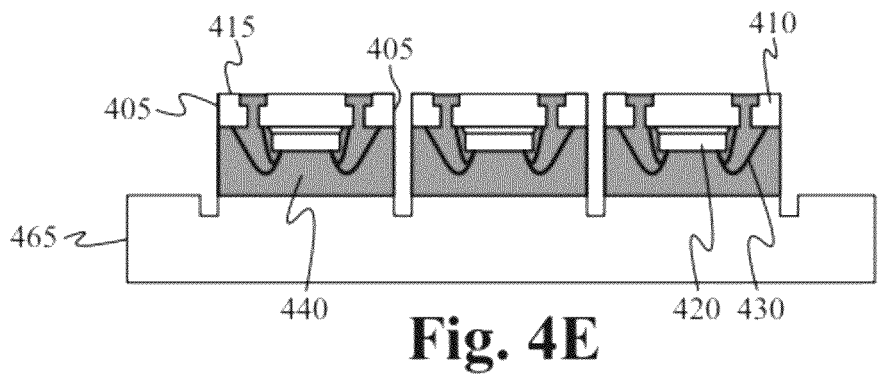
Figure 4F:
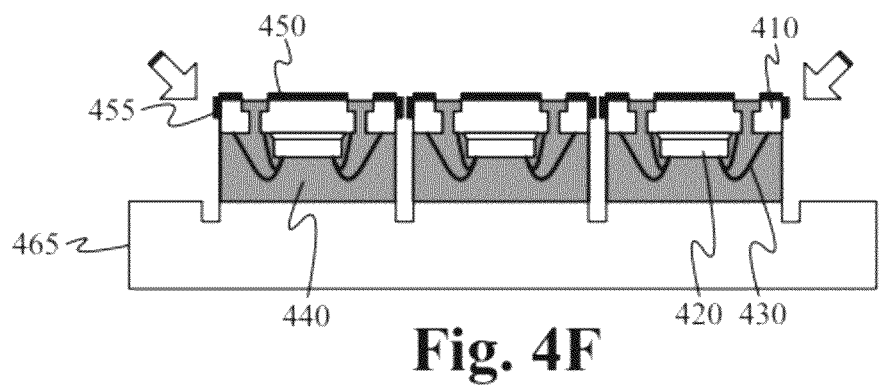

In FIG. 4E, the side surfaces 405 of the leads between neighboring semiconductor dies are exposed as a result of the singulation process. The singulated semiconductor packages can now be loaded to a plating process. In FIG. 4F, a plating process is performed to plate the bottom surfaces 415 and the side surfaces 405 with a plating material 450 and 455, respectively. In a preferred embodiment, the plating material is a material configured not to react with oxygen. In some embodiments, the plating material is a metallic material. In some embodiments, the plating material is tin. Other materials that can be used as the plating material include, but are not limited to, silver, gold, nickel-gold, nickel-palladium, and nickel-palladium-gold.

Figure 4G:
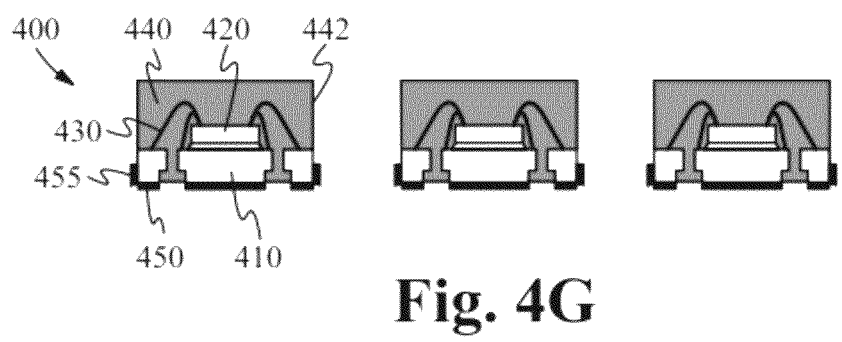

FIG. 4G shows the finished individual semiconductor packages 400, similar to the semiconductor package 200 in FIG. 2. Each semiconductor package 400 has a semiconductor die 420 and a leadframe 410 at least partially encased in the molding compound 440, with the leads of each leadframe 410 being accessible to electrical coupling via the plating material 450 and 455 over the portions of the leads that are exposed from the molding compound 440. Each semiconductor package 400 has side surfaces 442 that are formed from the molding compound. In some embodiments, the side surfaces 442 are straight from top to bottom, as shown in FIG. 4H.

Figure 5A:
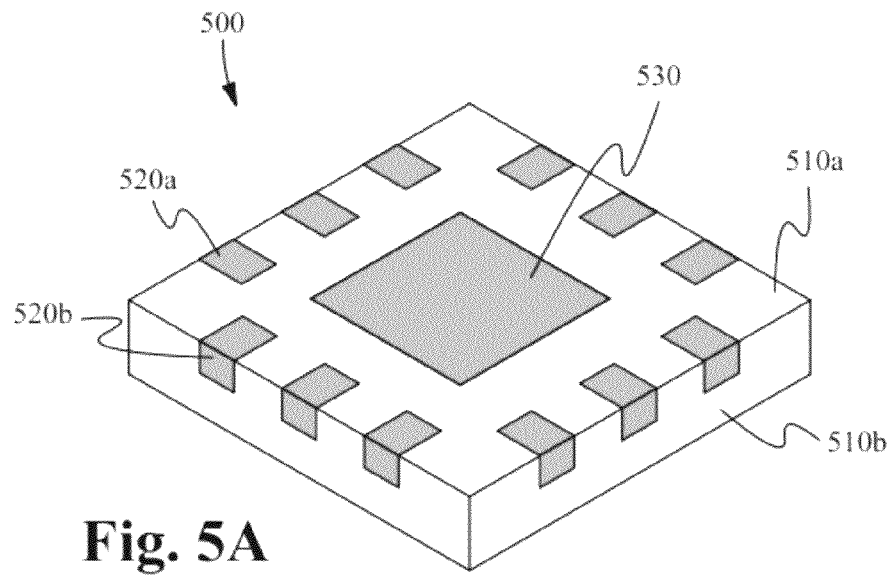
FIG. 5A is a perspective view of the top of a semiconductor package formed with full cutting in accordance with some embodiments of the present invention.
Figure 5B:
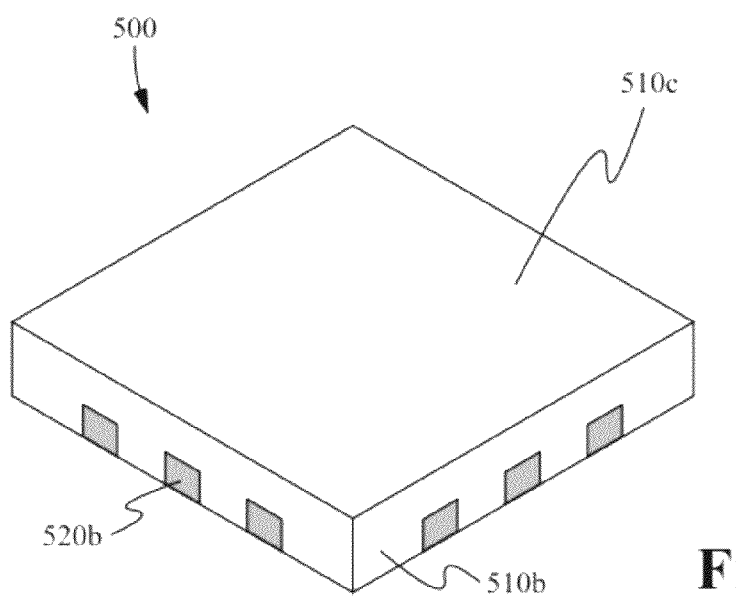
FIG. 5B is a perspective view of the bottom of the semiconductor package with full cutting in accordance with some embodiments of the present invention.

FIGS. 5A and 5B illustrate perspective views of the top and the bottom of a semiconductor package 500 formed with full cutting in accordance with some embodiments of the present invention. Semiconductor package 500 has a top surface 510a, a bottom surface 510c opposite the top surface 510a, and side surfaces 510b between top surface 510a and bottom surface 510c, preferably all formed by a molding compound. A leadframe is encased in the molding compound, with the top surfaces 520a and side surfaces 520b of its leads being exposed. In some embodiments, the leads are copper. However, it is contemplated that other materials besides copper can be used to form the leads. In some embodiments, the region 530 of the leadframe corresponding to the die attach pad of the leadframe is also exposed. The top surfaces 520a, side surfaces 520b, and region 530 are plated with a plating material. In some embodiments, the plating material on the surfaces is a material configured not to react with oxygen. In some embodiments, the plating material is a metallic material. In some embodiments, the plating material is tin. Other materials that can be used as the plating material include, but are not limited to, silver, gold, nickel-gold, nickel-palladium, and nickel-palladium-gold.

In some embodiments, the side surfaces 510b of the semiconductor package 500 are straight, as seen in FIGS. 5A-B. However, it is contemplated that the side surfaces of the semiconductor package can be configured in other shapes, as will be discussed in more detail below.

Figure 6A:
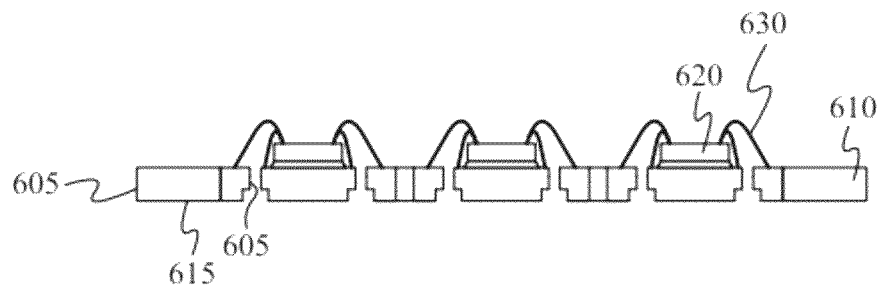
FIGS. 6A-H illustrate different stages of a singulation and plating process using partial cutting in accordance with some embodiments of the present invention.
Figure 6B:
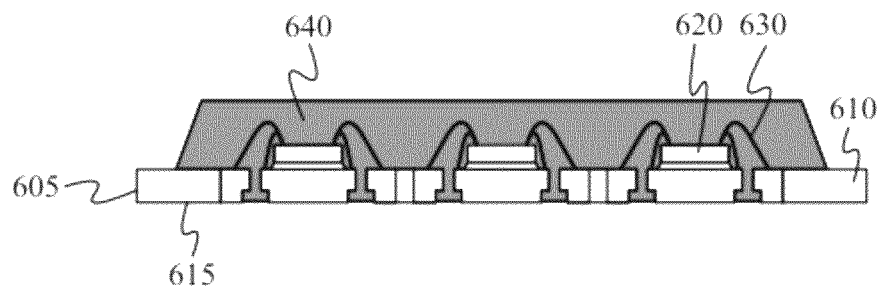

FIGS. 6A-H illustrate different stages of a singulation and plating process using partial cutting in accordance with some embodiments of the present invention. In FIG. 6A, a plurality of semiconductor dies 620 are each coupled to a surface of the same leadframe 610 (e.g., a leadframe strip). In a preferred embodiment, each of the semiconductor dies 620 is attached to a die attach pad on the leadframe 610. The leadframe 610 comprises a side surface 605 that extends between a bottom surface 615 of the leadframe and the top surface of the leadframe (i.e., the surface to which the semiconductor dies are attached). It is contemplated that the semiconductor dies 620 can be coupled to the leadframe 610 in a variety of different ways, including, but not limited to, using soldering flux. The semiconductor dies 620 are wire bonded to the leadframe 610 using wires 630. It is contemplated that a variety of different types of materials can be used to form the bonding wires 630, including, but not limited to, aluminum, copper, and gold. In FIG. 6B, a molding process is performed to encase the semiconductor dies 620, the leadframe 610, and the bonding wires 630 in a molding compound 640.

Figure 6C:
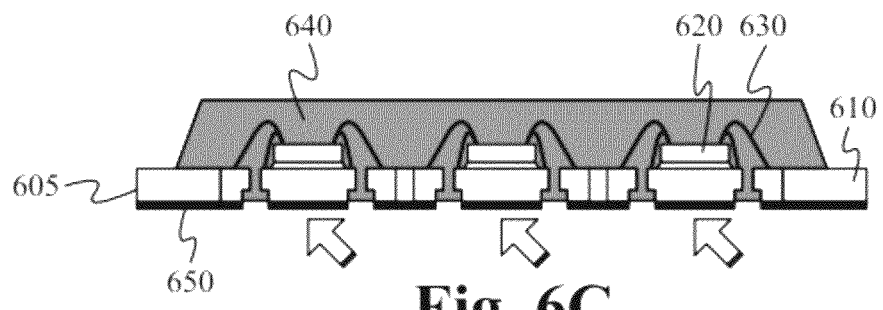

In FIG. 6C, a plating process is performed to plate the bottom surface 615 with a plating material 650. In a preferred embodiment, the plating material 650 is a material configured not to react with oxygen. In some embodiments, the plating material 650 is a metallic material. In some embodiments, the plating material 650 is tin. Other materials that can be used as the plating material 650 include, but are not limited to, silver, gold, nickel-gold, nickel-palladium, and nickel-palladium-gold.

Figure 6D:
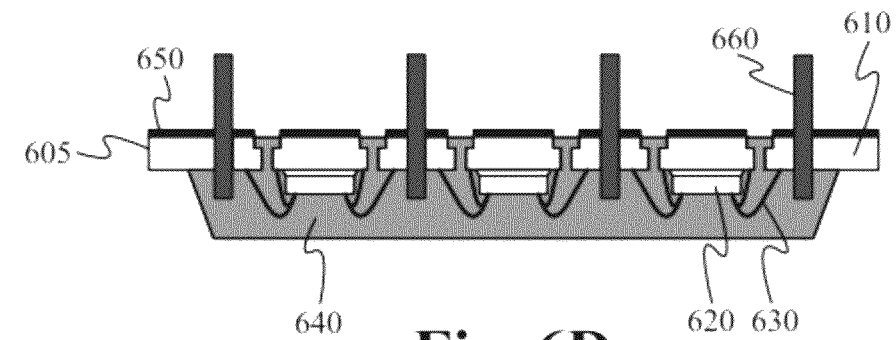

In FIG. 6D, a partial singulation process is performed on the leadframe strip 610. In a preferred embodiment, blades 660 are used to partially singulate the semiconductor packages. For example, in some embodiments, the blades 660 cut through the entire leadframe 610, but do not pass through all of the molding compound 640, thereby forming side surface 642 of the molding compound between neighboring semiconductor dies 620, but still leaving the individual semiconductor packages attached to one another.

Figure 6E:
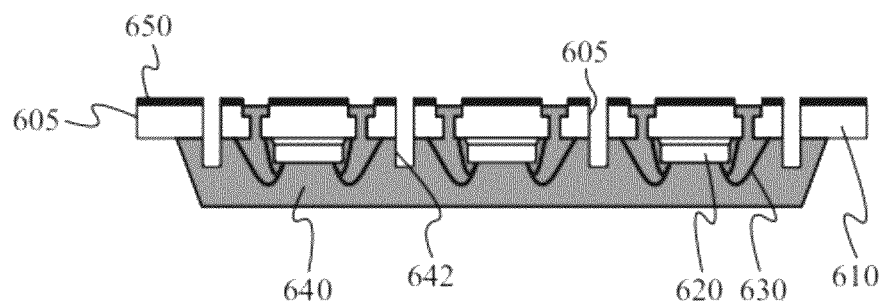
Figure 6F:
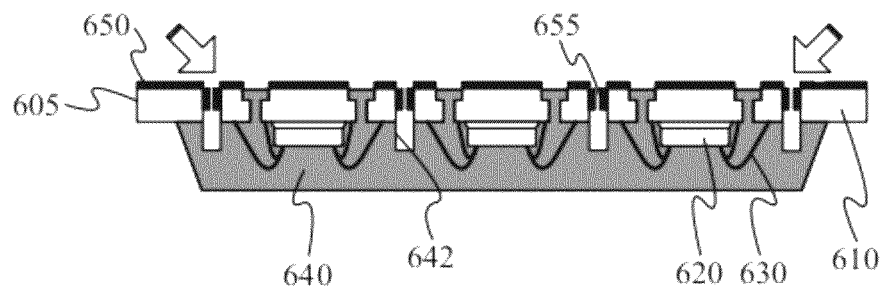

In FIG. 6E, the side surfaces 605 of the leads between neighboring semiconductor dies 620 are exposed as a result of the partial singulation process. The singulated semiconductor packages can now be loaded to another plating process. In FIG. 6F, the exposed side surfaces 605 of the leads are plated with a plating material 655. As discussed above, the plating material 655 is preferably a material configured not to react with oxygen. In some embodiments, the plating material 655 is a metallic material. In some embodiments, the plating material 655 is tin. Other materials that can be used as the plating material 650 include, but are not limited to, silver, gold, and nickel-gold.

Figure 6G:
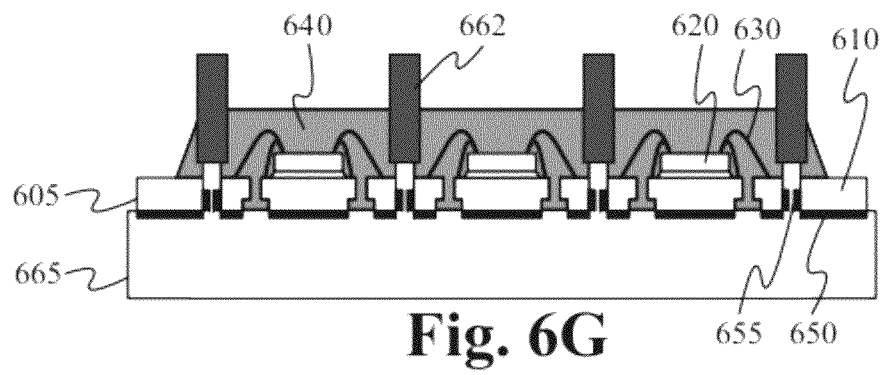

In FIG. 6G, another partial singulation process is performed on the leadframe strip 610 in order to complete the singulation of the semiconductor packages. In a preferred embodiment, blades 662 are used to singulate the semiconductor packages. In some embodiments, the blades 662 have a different shape than the blades 660 of the first partial singulation process in FIG. 6D. In some embodiments, the blades 662 have a different thickness than the blades 660. In some embodiments, the blades 662 have a greater thickness than the blades 660.

Figure 6H:
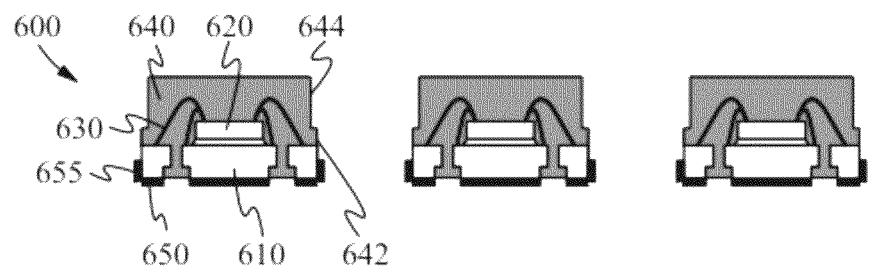

FIG. 6H shows the finished individual semiconductor packages 600, similar to the semiconductor package 200 in FIG. 2. Each semiconductor package 600 has a semiconductor die 620 and a leadframe 610 at least partially encased in the molding compound 640, with the leads of each leadframe 610 being accessible to electrical coupling via the plating material 650 and 655 over the portions of the leads that are exposed from the molding compound 640. Each semiconductor package 600 has side surfaces that are formed from the molding compound 640.

FIG. 6H shows the side surfaces of semiconductor package 600 having a first portion 642, formed from the first partial singulation blade 660, and a second portion 644, formed from the second partial singulation blade 662. Since the second singulation blade 662 was thicker than the first singulation blade 660, a step is formed on the side of the semiconductor package 600.

Figure 7A:
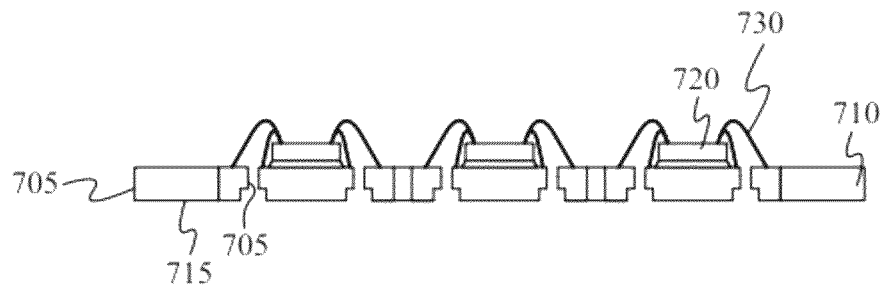
FIGS. 7A-G illustrate different stages of another singulation and plating process using partial cutting in accordance with some embodiments of the present invention.
Figure 7B:
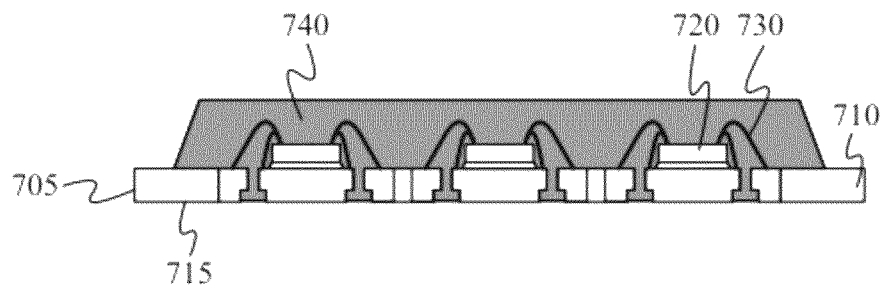

FIGS. 7A-G illustrate different stages of another singulation and plating process using partial cutting in accordance with some embodiments of the present invention. In FIG. 7A, a plurality of semiconductor dies 720 are each coupled to a surface of the same leadframe 710 (e.g., a leadframe strip). In a preferred embodiment, each of the semiconductor dies 720 is attached to a die attach pad on the leadframe 710. The leadframe 710 comprises a side surface 705 that extends between a bottom surface 715 of the leadframe and the top surface of the leadframe (i.e., the surface to which the semiconductor dies are attached). It is contemplated that the semiconductor dies 720 can be coupled to the leadframe 710 in a variety of different ways, including, but not limited to, using soldering flux. The semiconductor dies 720 are wire bonded to the leadframe 710 using wires 730. It is contemplated that a variety of different types of materials can be used to form the bonding wires 730, including, but not limited to, aluminum, copper, and gold. In FIG. 7B, a molding process is performed to encase the semiconductor dies 720, the leadframe 710, and the bonding wires 730 in a molding compound 740.

Figure 7C:
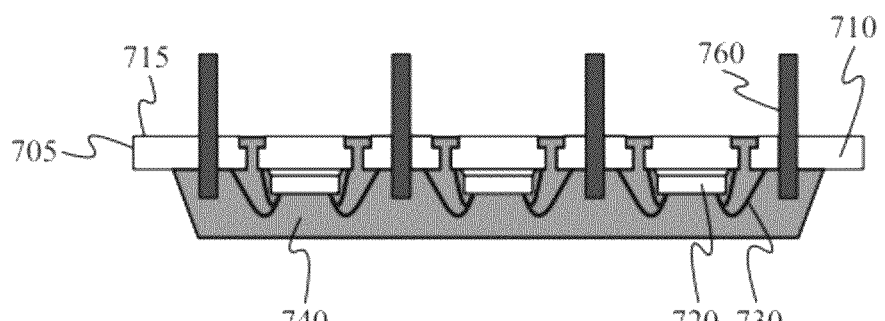

In FIG. 7C, a partial singulation process is performed on the leadframe strip 710. In a preferred embodiment, blades 760 are used to partially singulate the semiconductor packages. For example, in some embodiments, the blades 760 cut through the entire leadframe 710, but do not pass through all of the molding compound 740, thereby forming side surface 742 of the molding compound between neighboring semiconductor dies 720, but still leaving the individual semiconductor packages attached to one another.

Figure 7D:
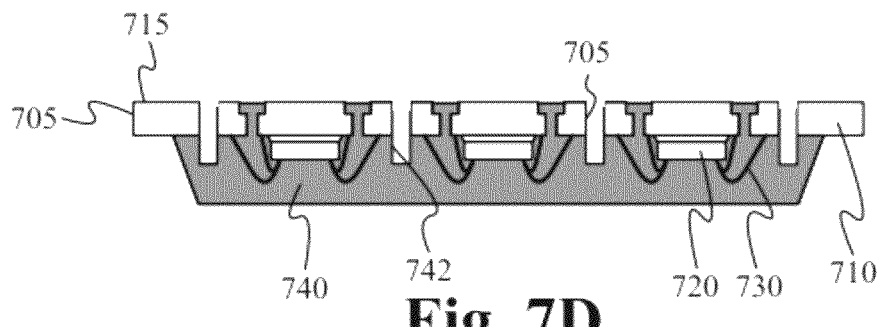
Figure 7E:
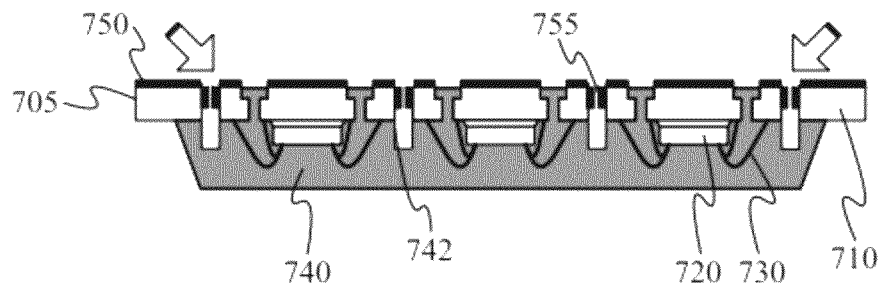

In FIG. 7D, the side surfaces 705 of the leads between neighboring semiconductor dies 720 are exposed as a result of the partial singulation process. The singulated semiconductor packages can now be loaded to a plating process. In FIG. 7E, the bottom surfaces 715 and the exposed side surfaces 705 of the leads are plated with a plating material 750 and 755, respectively. As discussed above, the plating material is preferably a material configured not to react with oxygen. In some embodiments, the plating material is a metallic material. In some embodiments, the plating material is tin. Other materials that can be used as the plating material include, but are not limited to, silver, gold, nickel-gold, nickel-palladium, and nickel-palladium-gold.

Figure 7F:
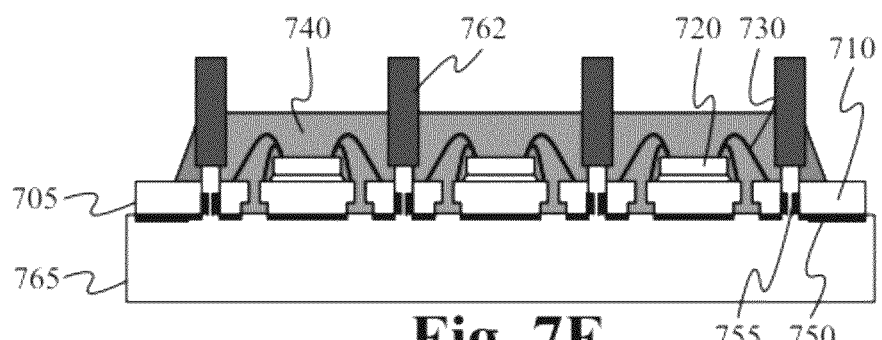

In FIG. 7F, another partial singulation process is performed on the leadframe strip 710 in order to complete the singulation of the semiconductor packages. In a preferred embodiment, blades 762 are used to singulate the semiconductor packages. In some embodiments, the blades 762 have a different shape than the blades 760 of the first partial singulation process in FIG. 7C. In some embodiments, the blades 762 have a different thickness than the blades 760. In some embodiments, the blades 762 have a greater thickness than the blades 760.

Figure 7G:
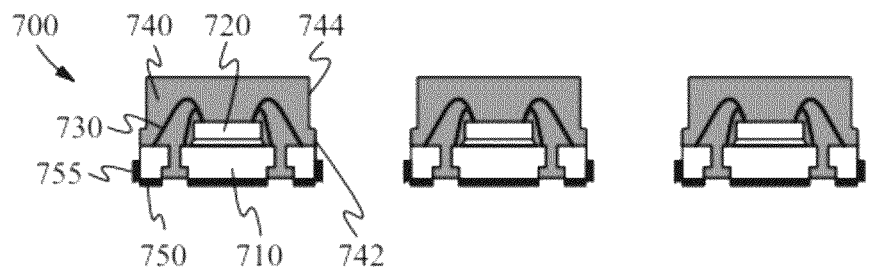

FIG. 7G shows the finished individual semiconductor packages 700, similar to the semiconductor package 200 in FIG. 2. Each semiconductor package 700 has a semiconductor die 720 and a leadframe 710 at least partially encased in the molding compound 740, with the leads of each leadframe 710 being accessible to electrical coupling via the plating material 750 and 755 over the portions of the leads that are exposed from the molding compound 740. Each semiconductor package 700 has side surfaces that are formed from the molding compound 740.

FIG. 7G shows the side surfaces of semiconductor package 700 having a first portion 742, formed from the first partial singulation blade 760, and a second portion 744, formed from the second partial singulation blade 762. Since the second singulation blade 762 was thicker than the first singulation blade 760, a step is formed on the side of the semiconductor package 700.

Figure 8:
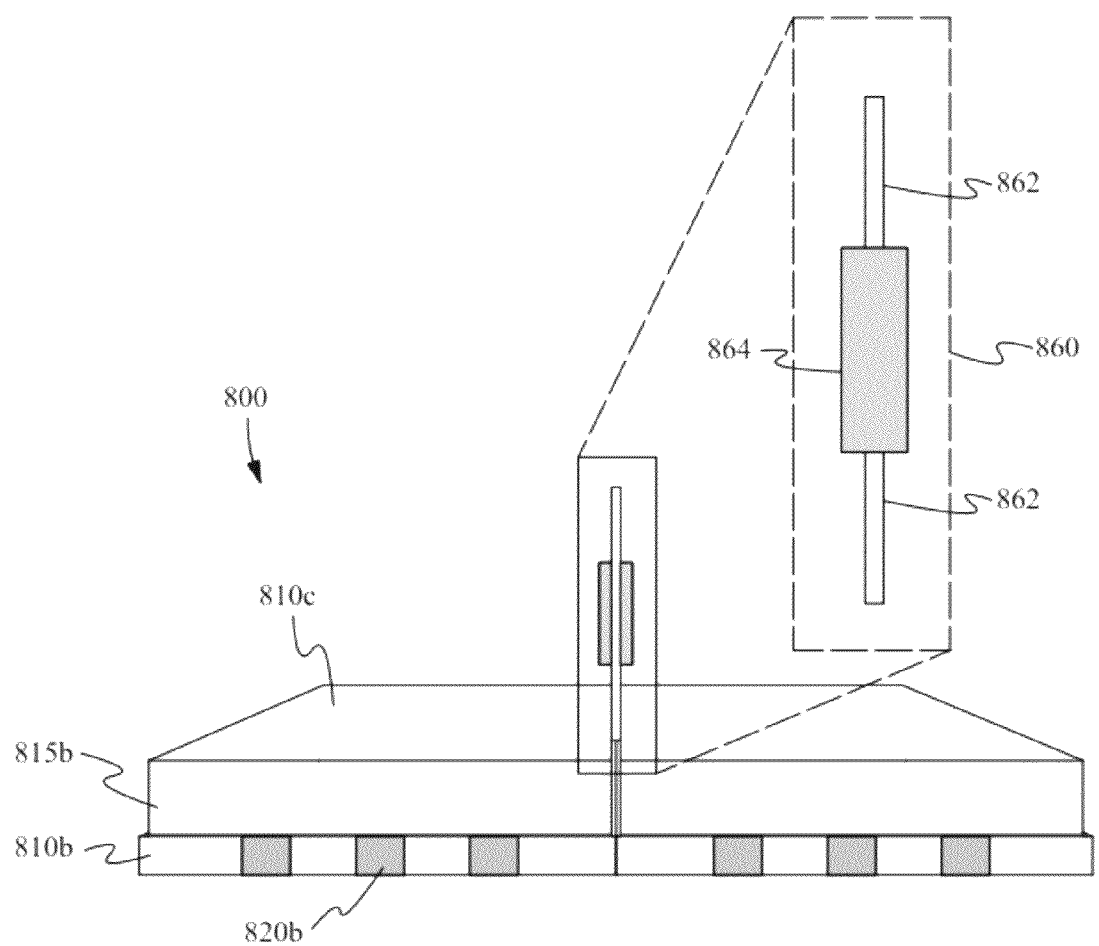
FIG. 8 is a cross-sectional perspective view of a partial cutting of a semiconductor package in accordance with some embodiments of the present invention.

FIG. 8 is a cross-sectional perspective view of a partial cutting of a semiconductor package 800 in accordance with some embodiments of the present invention. In FIG. 8, semiconductor package 800 comprises a semiconductor die and a leadframe encased within a molding compound, with the side surface of leads 820b being exposed from the molding compound. During the partial singulation cutting of the semiconductor package 800, a cutting blade 860 cuts through the molding compound and/or the leadframe. In FIG. 8, the cutting blade 860 is shown cutting through the bottom surface 810c of the semiconductor package 800, which is positioned with its bottom surface 810c facing upwards. In some embodiments, different blades are used for different cuttings. For example, in FIG. 8, blade assembly 860 comprises a blade 862 extending from a shank 864, which is used by a tool to hold and manipulate the blade 862. During a first cutting operation, a first blade can be stopped at a certain depth of the semiconductor package 800. In a subsequent cutting operation, a second blade having a different thickness as the first blade can be used to cut through the remaining portion of the semiconductor package 800. In some embodiments, this subsequent cutting operation is performed from an opposite side of the semiconductor package 800 as the first cutting operation. As a result of the different thicknesses of the blades, a step can be formed between a first side surface 810b, formed by the thinner blade, and a second side surface 815b, formed by the thicker blade.

Figure 9A:
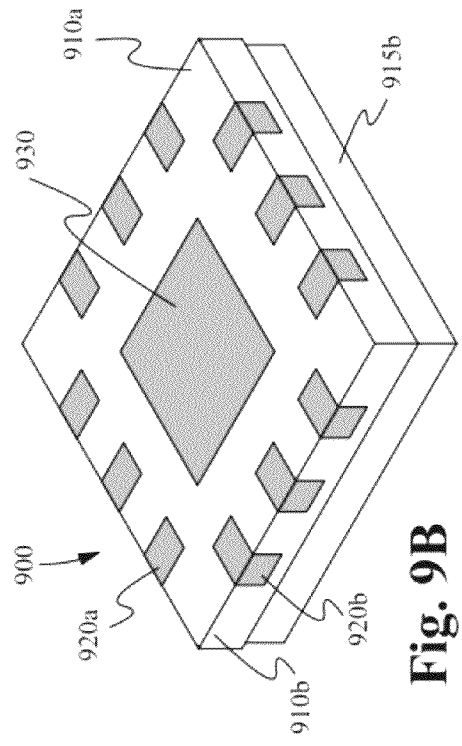
FIG. 9A is a perspective view of the bottom of a semiconductor package having a first step height formed with partial cutting in accordance with some embodiments of the present invention.
Figure 9B:
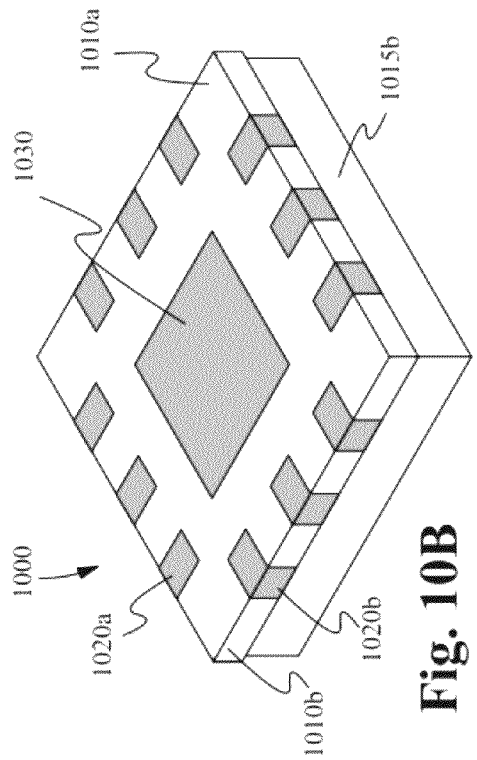
FIG. 9B is a perspective view of the top of the semiconductor package having a first step height formed with partial cutting in accordance with some embodiments of the present invention.

FIGS. 9A and 9B illustrate perspective views of the bottom and top of a semiconductor package 900 having a first step height formed with partial cutting in accordance with some embodiments of the present invention. In some embodiments, the semiconductor package 900 is singulated and its step is formed using a blade assembly such as blade 860 in FIG. 8. Semiconductor package 900 has a top surface 910a, a bottom surface 910c opposite the top surface 910a, and side surfaces between top surface 910a and bottom surface 910c, preferably all formed by a molding compound. A leadframe is encased in the molding compound, with the top surfaces 920a and side surfaces 920b of its leads being exposed. In some embodiments, the leads are copper. However, it is contemplated that other materials besides copper can be used to form the leads. In some embodiments, the region 930 of the leadframe corresponding to the die attach pad of the leadframe is also exposed. The top surfaces 920a, side surfaces 920b, and region 930 are plated with a plating material. In some embodiments, the plating material on the surfaces is a material configured not to react with oxygen. In some embodiments, the plating material is a metallic material. In some embodiments, the plating material is tin. Other materials that can be used as the plating material include, but are not limited to, silver, gold, nickel-gold, nickel-palladium, and nickel-palladium-gold.

In some embodiments, the side surfaces of the semiconductor package 900 have a first portion 910b, formed from a first partial singulation blade, and a second portion 915b, formed from a second partial singulation blade that is thicker than the first partial singulation blade. As a result of the second singulation blade being thicker than the first singulation blade, a step is formed on the side of the semiconductor package 900.

Figure 10A:
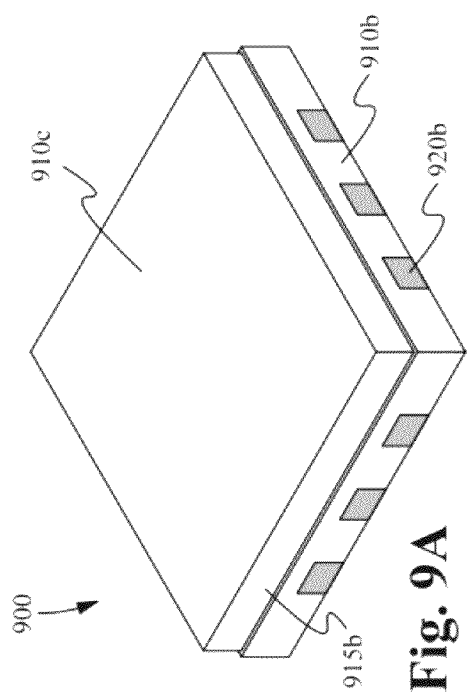
FIG. 10A is a perspective view of the bottom of a semiconductor package having a second step height formed with partial cutting in accordance with some embodiments of the present invention.
Figure 10B:
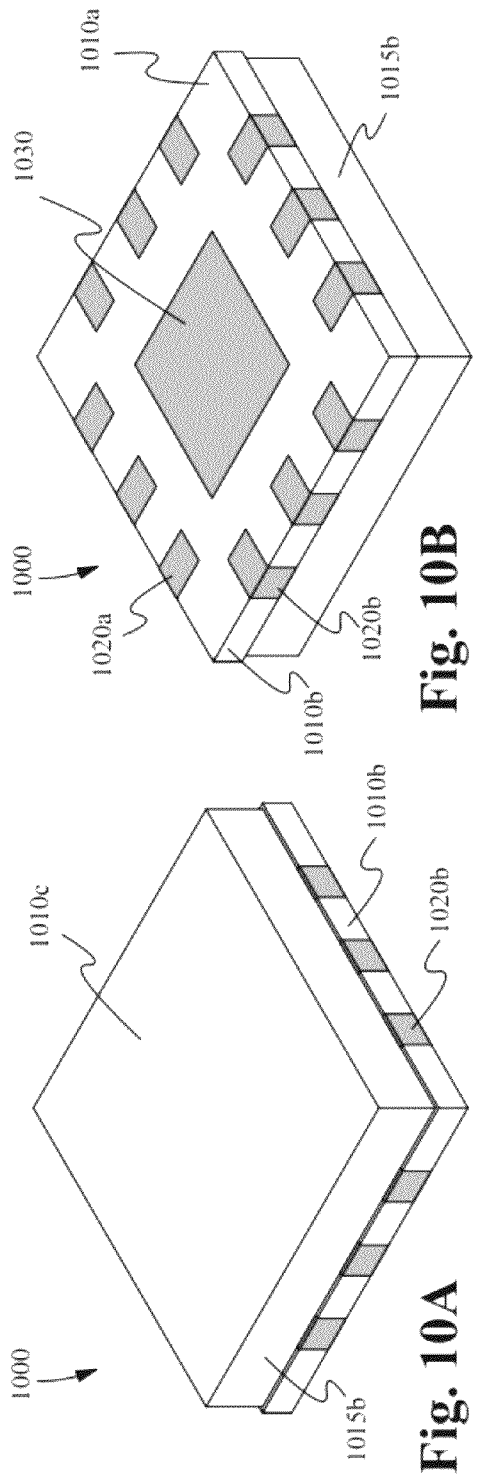
FIG. 10B is a perspective view of the top of the semiconductor package having a second step height formed with partial cutting in accordance with some embodiments of the present invention.

FIGS. 10A and 10B illustrate perspective views of the bottom and top of a semiconductor package 1000 having a second step height formed with partial cutting in accordance with some embodiments of the present invention. Semiconductor package 1000 is almost identical to semiconductor package 900, except for the height of the step on its side surface. Semiconductor package 1000 has a top surface 1010a, a bottom surface 1010c opposite the top surface 1010a, and side surfaces between top surface 1010a and bottom surface 1010c, preferably all formed by a molding compound. A leadframe is encased in the molding compound, with the top surfaces 1020a and side surfaces 1020b of its leads being exposed. In some embodiments, the leads are copper. However, it is contemplated that other materials besides copper can be used to form the leads. In some embodiments, the region 1030 of the leadframe corresponding to the die attach pad of the leadframe is also exposed. The top surfaces 1020a, side surfaces 1020b, and region 1030 are plated with a plating material. In some embodiments, the plating material on the surfaces is a material configured not to react with oxygen. In some embodiments, the plating material is a metallic material. In some embodiments, the plating material is tin. Other materials that can be used as the plating material include, but are not limited to, silver, gold, nickel-gold, nickel-palladium, and nickel-palladium-gold.

In some embodiments, the side surfaces of the semiconductor package 1000 have a first portion 1010b, formed from a first partial singulation blade, and a second portion 1015b, formed from a second partial singulation blade that is thicker than the first partial singulation blade. As a result of the second singulation blade being thicker than the first singulation blade, a step is formed on the side of the semiconductor package 1000. As mentioned above, semiconductor package 1000 is almost identical to semiconductor package 900, except for the height of the step on its side surface. The first portion 910b and the second portion 915b of the side surfaces in FIG. 9 are substantially equal in height, whereas the first portion 1010b of the side surface in FIGS. 10A-B is substantially smaller in height than the second portion 1015b of the side surfaces in FIGS. 10A-B.

Figure 11A:
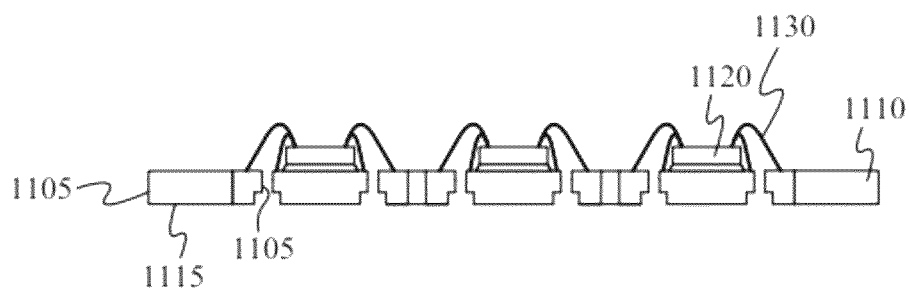
FIGS. 11A-H illustrate different stages of a singulation and plating process using partial cutting with a partial bevel-edged blade in accordance with some embodiments of the present invention.
Figure 11B:
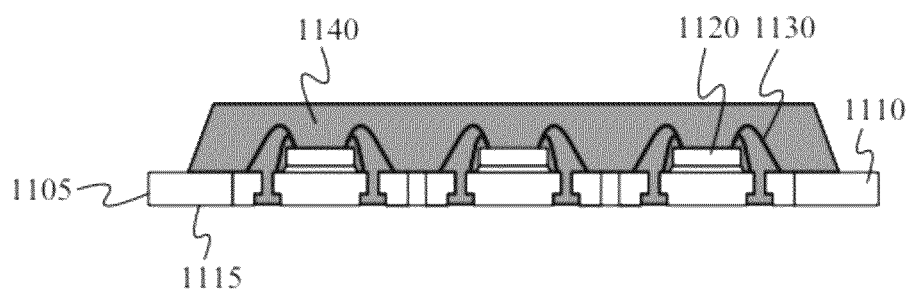

FIGS. 11A-H illustrate different stages of a singulation and plating process using partial cutting with a partial bevel-edged blade in accordance with some embodiments of the present invention. In FIG. 11A, a plurality of semiconductor dies 1120 are each coupled to a surface of the same leadframe 1110 (e.g., a leadframe strip). In a preferred embodiment, each of the semiconductor dies 1120 is attached to a die attach pad on the leadframe 1110. The leadframe 1110 comprises a side surface 1105 that extends between a bottom surface 1115 of the leadframe and the top surface of the leadframe (i.e., the surface to which the semiconductor dies are attached). It is contemplated that the semiconductor dies 1120 can be coupled to the leadframe 1110 in a variety of different ways, including, but not limited to, using soldering flux. The semiconductor dies 1120 are wire bonded to the leadframe 1110 using wires 1130. It is contemplated that a variety of different types of materials can be used to form the bonding wires 1130, including, but not limited to, aluminum, copper, and gold. In FIG. 11B, a molding process is performed to encase the semiconductor dies 1120, the leadframe 1110, and the bonding wires 1130 in a molding compound 1140.

Figure 11C:
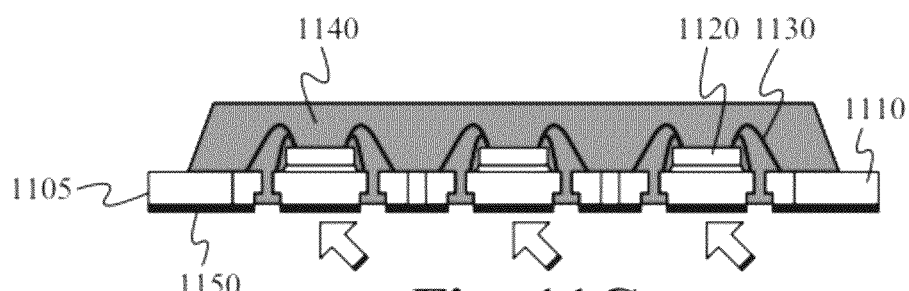

In FIG. 11C, a plating process is performed to plate the bottom surface 1115 with a plating material 1150. In a preferred embodiment, the plating material 1150 is a material configured not to react with oxygen. In some embodiments, the plating material 1150 is a metallic material. In some embodiments, the plating material 1150 is tin. Other materials that can be used as the plating material 1150 include, but are not limited to, silver, gold, nickel-gold, nickel-palladium, and nickel-palladium-gold.

Figure 11D:
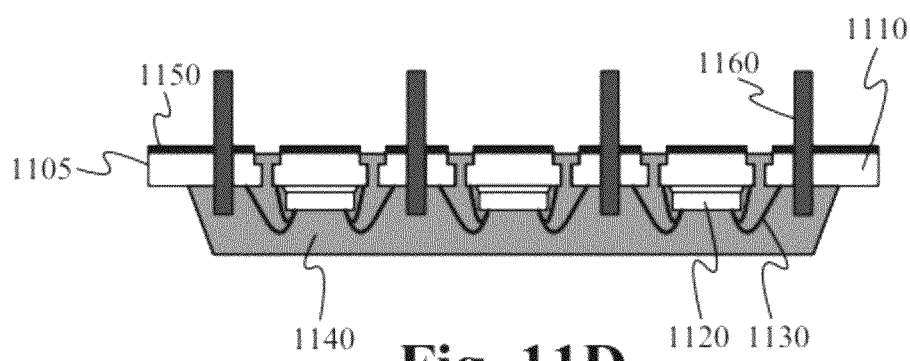

In FIG. 11D, a partial singulation process is performed on the leadframe strip 1110. In a preferred embodiment, blades 1160 are used to partially singulate the semiconductor packages. For example, in some embodiments, the blades 1160 cut through the entire leadframe 1110, but do not pass through all of the molding compound 1140, thereby forming side surface 1142 of the molding compound between neighboring semiconductor dies 1120, but still leaving the individual semiconductor packages attached to one another.

Figure 11E:
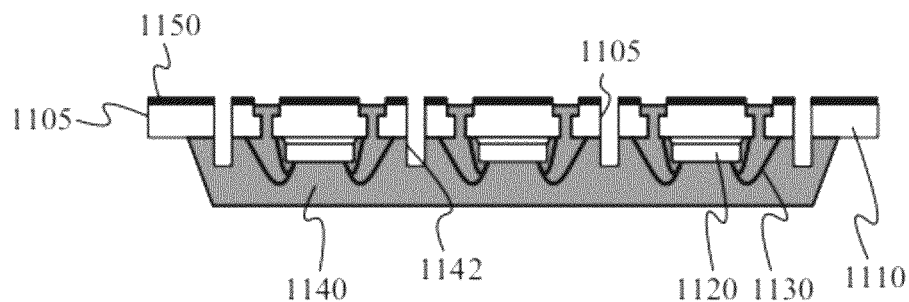
Figure 11F:
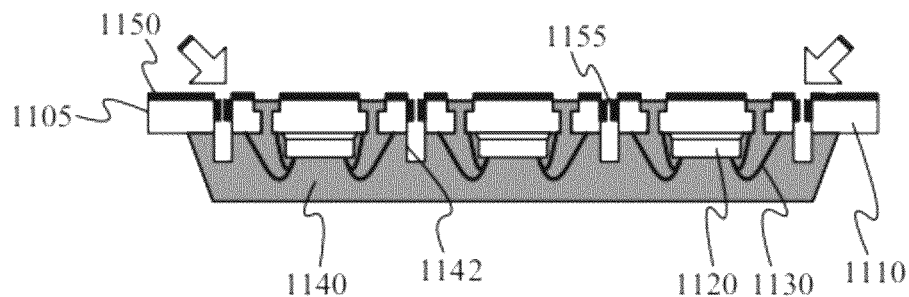

In FIG. 11E, the side surfaces 1105 of the leads between neighboring semiconductor dies 1120 are exposed as a result of the partial singulation process. The singulated semiconductor packages can now be loaded to another plating process. In FIG. 11F, the exposed side surfaces 1105 of the leads are plated with a plating material 1155. As discussed above, the plating material 1155 is preferably a material configured not to react with oxygen. In some embodiments, the plating material 1155 is a metallic material. In some embodiments, the plating material 1155 is tin. Other materials that can be used as the plating material 1150 include, but are not limited to, silver, gold, and nickel-gold.

Figure 11G:
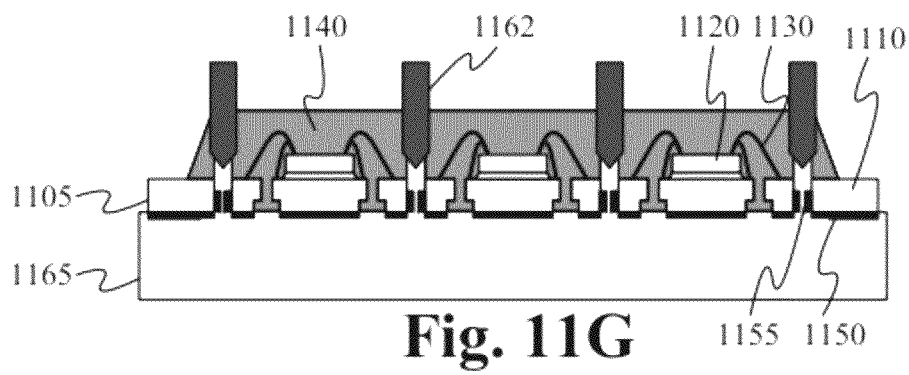

In FIG. 11G, another partial singulation process is performed on the leadframe strip 1110 in order to complete the singulation of the semiconductor packages. In a preferred embodiment, blades 1162 are used to singulate the semiconductor packages. In some embodiments, the blades 1162 of have a different shape than the blades 1160 of the first partial singulation process in FIG. 11D. In some embodiments, the blades 1162 have a beveled edge.

Figure 11H:
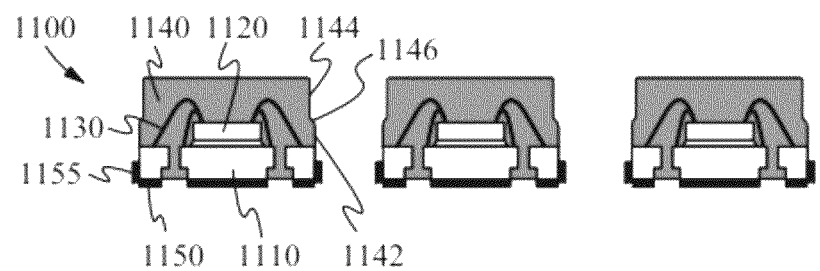

FIG. 11H shows the finished individual semiconductor packages 1100, similar to the semiconductor package 200 in FIG. 2. Each semiconductor package 1100 has a semiconductor die 1120 and a leadframe 1110 at least partially encased in the molding compound 1140, with the leads of each leadframe 1110 being accessible to electrical coupling via the plating material 1150 and 1155 over the portions of the leads that are exposed from the molding compound 1140. Each semiconductor package 1100 has side surfaces that are formed from the molding compound 1140. FIG. 11H shows the side surfaces of semiconductor package 1100 having a first portion 1142, formed from the first partial singulation blade 1160, and a second portion 1144, formed from the second partial singulation blade 1162. A beveled surface 1146, formed from the beveled edge of the second partial singulation blade 1162, extends from the first portion 1142 to the second portion 1144.

Figure 12A:
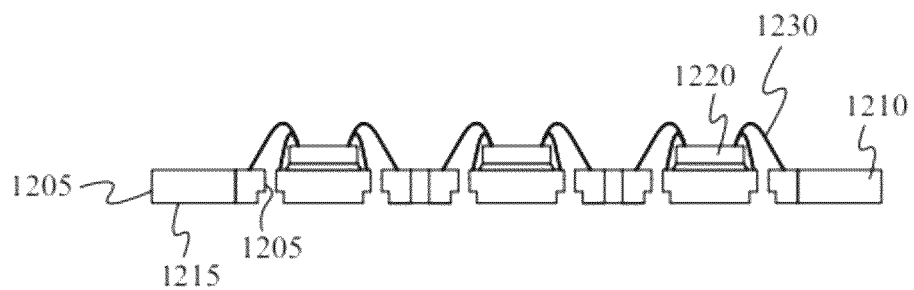
FIGS. 12A-G illustrate different stages of another singulation and plating process using partial cutting with a partial bevel-edged blade in accordance with some embodiments of the present invention.
Figure 12B:
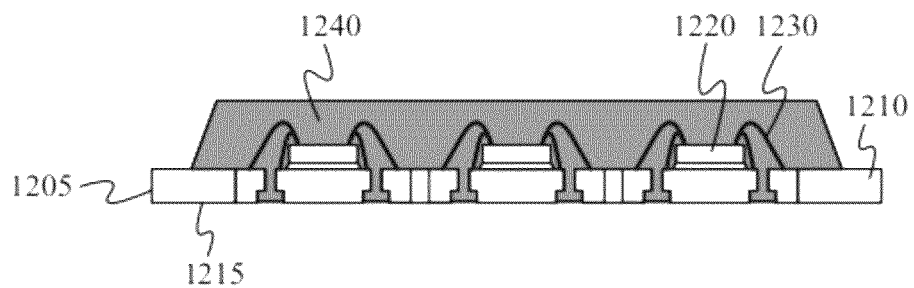

FIGS. 12A-G illustrate different stages of another singulation and plating process using partial cutting with a partial bevel-edged blade in accordance with some embodiments of the present invention. In FIG. 12A, a plurality of semiconductor dies 1220 are each coupled to a surface of the same leadframe 1210 (e.g., a leadframe strip). In a preferred embodiment, each of the semiconductor dies 1220 is attached to a die attach pad on the leadframe 1210. The leadframe 1210 comprises a side surface 1205 that extends between a bottom surface 1215 of the leadframe and the top surface of the leadframe (i.e., the surface to which the semiconductor dies are attached). It is contemplated that the semiconductor dies 1220 can be coupled to the leadframe 1210 in a variety of different ways, including, but not limited to, using soldering flux. The semiconductor dies 1220 are wire bonded to the leadframe 1210 using wires 1230. It is contemplated that a variety of different types of materials can be used to form the bonding wires 1230, including, but not limited to, aluminum, copper, and gold. In FIG. 12B, a molding process is performed to encase the semiconductor dies 1220, the leadframe 1210, and the bonding wires 1230 in a molding compound 1240.

Figure 12C:
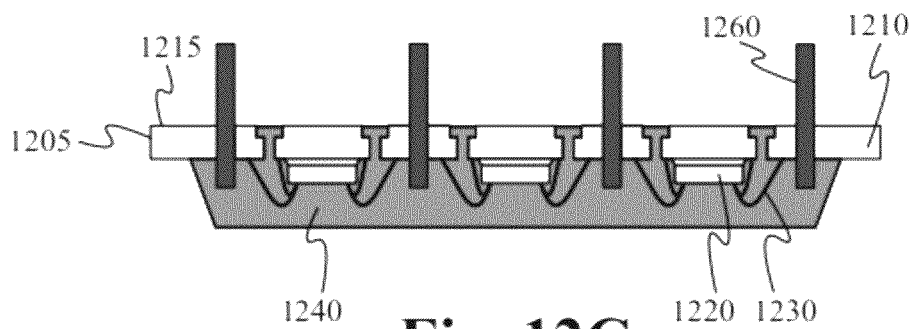

In FIG. 12C, a partial singulation process is performed on the leadframe strip 1210. In a preferred embodiment, blades 1260 are used to partially singulate the semiconductor packages. For example, in some embodiments, the blades 1260 cut through the entire leadframe 1210, but do not pass through all of the molding compound 1240, thereby forming side surface 1242 of the molding compound between neighboring semiconductor dies 1220, but still leaving the individual semiconductor packages attached to one another.

Figure 12D:
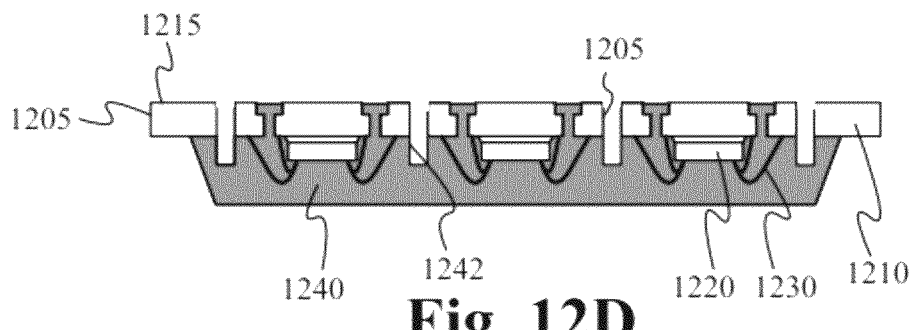
Figure 12E:
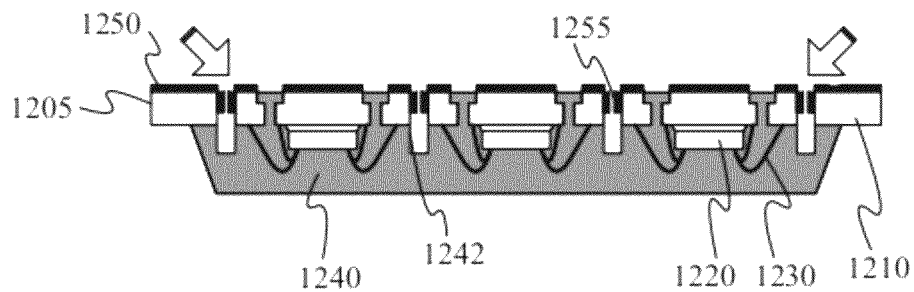

In FIG. 12D, the side surfaces 1205 of the leads between neighboring semiconductor dies 1220 are exposed as a result of the partial singulation process. The singulated semiconductor packages can now be loaded to a plating process. In FIG. 12E, the bottom surfaces 1215 and the exposed side surfaces 1205 of the leads are plated with a plating material 1250 and 1255, respectively. As discussed above, the plating material is preferably a material configured not to react with oxygen. In some embodiments, the plating material is a metallic material. In some embodiments, the plating material is tin. Other materials that can be used as the plating material include, but are not limited to, silver, gold, nickel-gold, nickel-palladium, and nickel-palladium-gold.

Figure 12F:
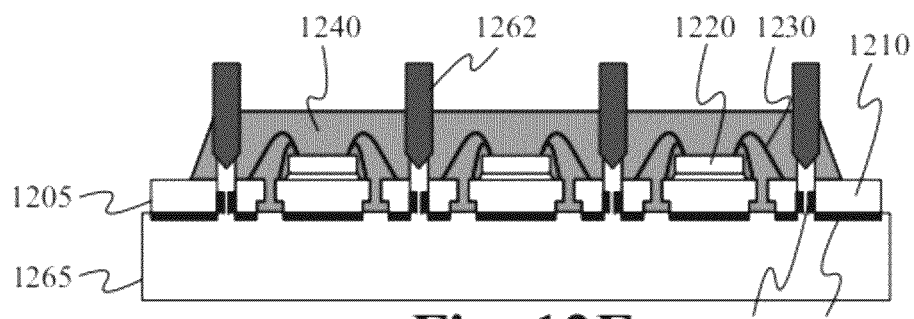

In FIG. 12F, another partial singulation process is performed on the leadframe strip 1210 in order to complete the singulation of the semiconductor packages. In a preferred embodiment, blades 1262 are used to singulate the semiconductor packages. In some embodiments, the blades 1262 have a different shape than the blades 1260 of the first partial singulation process in FIG. 12C. Preferably, the blades 1262 are beveled. In some embodiments, the blades 1262 have a different thickness than the blades 1260. In some embodiments, the blades 1262 have a greater thickness than the blades 1260.

Figure 12G:
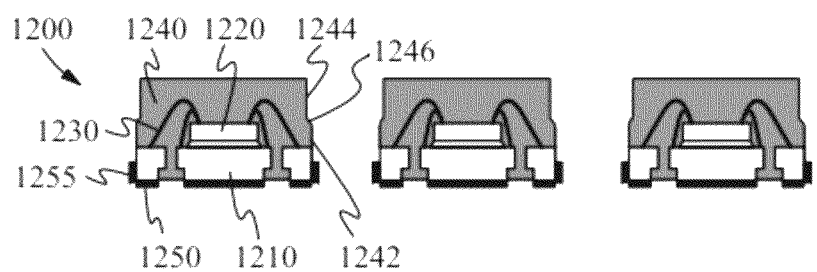

FIG. 12G shows the finished individual semiconductor packages 1200, similar to the semiconductor package 200 in FIG. 2. Each semiconductor package 1200 has a semiconductor die 1220 and a leadframe 1210 at least partially encased in the molding compound 1240, with the leads of each leadframe 1210 being accessible to electrical coupling via the plating material 1250 and 1255 over the portions of the leads that are exposed from the molding compound 1240. Each semiconductor package 1200 has side surfaces that are formed from the molding compound 1240. FIG. 12G shows the side surfaces of semiconductor package 1200 having a first portion 1242, formed from the first partial singulation blade 1260, and a second portion 1244, formed from the second partial singulation blade 1262. A beveled surface 1246, formed from the beveled edge of the second partial singulation blade 1262, extends from the first portion 1242 to the second portion 1244.

Figure 13:
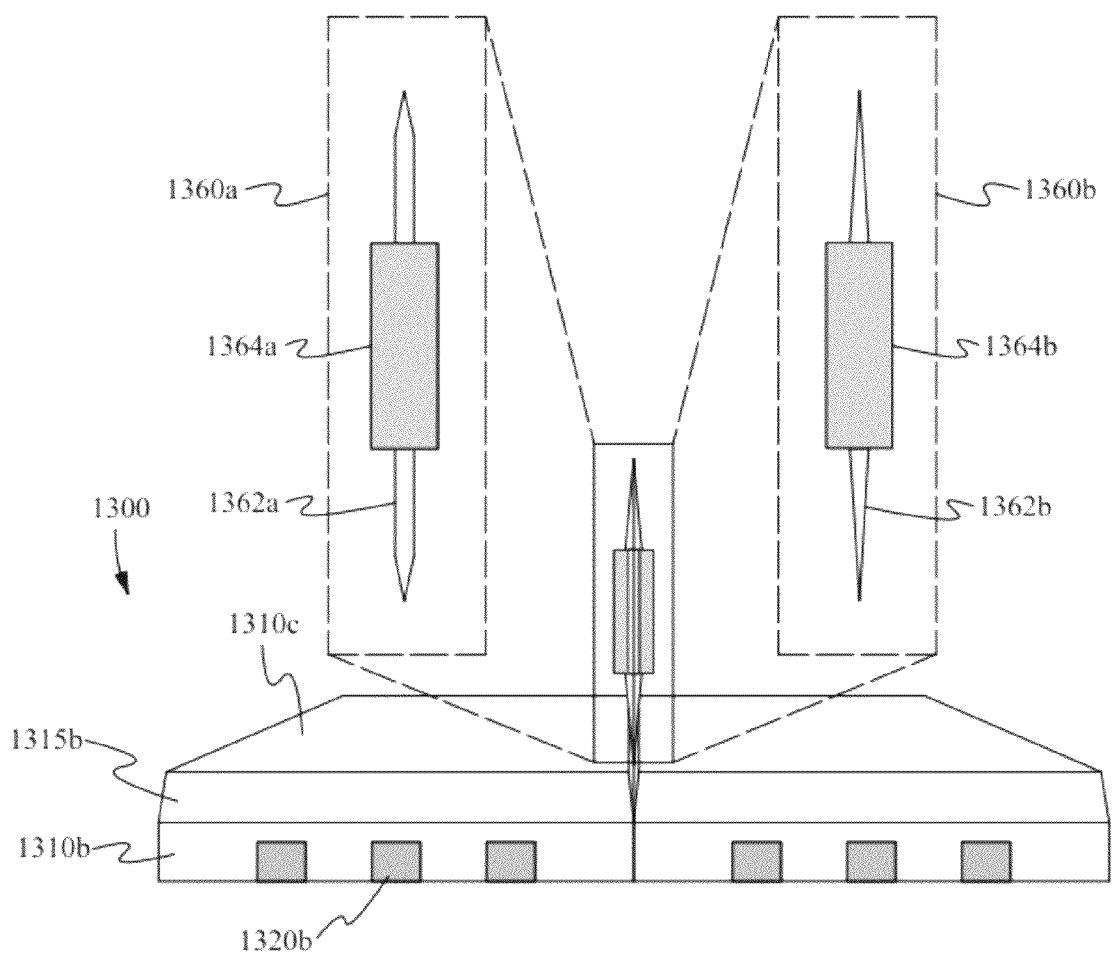
FIG. 13 is a cross-sectional perspective view of a partial cutting of a semiconductor package with both partial and full bevel-edged blades in accordance with some embodiments of the present invention.

FIG. 13 is a cross-sectional perspective view of a partial cutting of a semiconductor package 1300 with both partial and full bevel-edged blade assemblies 1360a and 1360b, respectively, in accordance with some embodiments of the present invention. In FIG. 13, semiconductor package 1300 comprises a semiconductor die and a leadframe encased within a molding compound, with the side surface of leads 1320b being exposed from the molding compound. During the partial singulation cutting of the semiconductor package 1300, a cutting blade cuts through the molding compound and/or the leadframe. In FIG. 13, the cutting blade is shown cutting through the bottom surface 1310c of the semiconductor package 1300, which is positioned with its bottom surface 1310c facing upwards. In some embodiments, a partially or fully bevel-edged blade can be used to form a beveled side surface 1315b of the semiconductor package 1300. In some embodiments, the side surface of the semiconductor package 1300 comprises a non-beveled side surface 1310b and the beveled side surface 1315b. In some embodiments, the non-beveled side surface 1310b is formed from a straight-edged blade, such as blade 860 shown in FIG. 8, and the beveled side surface 1315b is formed from a bevel-edged blade, which can either be partially beveled, such as blade 1362a of blade assembly 1360a, or fully beveled, such as blade 1362b of blade assembly 1360b. In some embodiments, the partially bevel-edged blade 1362a and the fully bevel-edged blade 1362b extend from shanks 1364a and 1364b, respectively. In some embodiments, the shanks 1364a and 1364b are used to hold and manipulate the blades 1362a and 1362b, respectively. As seen in FIG. 13, partially beveled blade 1362a comprises a non-beveled portion extending from the shank 1364a to a beveled portion, while fully beveled blade 1362b is tapered all the way from the shank 1364b to its end.

Figure 14A:
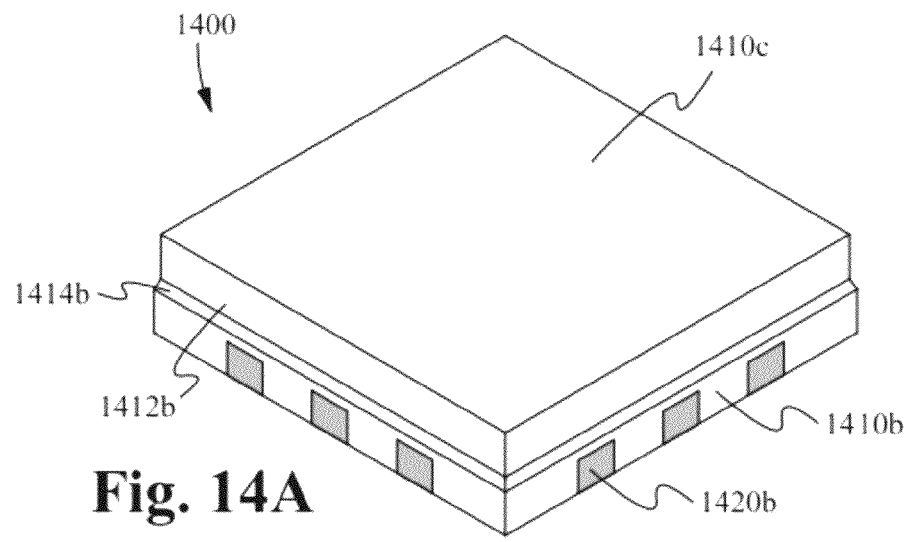
FIG. 14A is a perspective view of the bottom of a semiconductor package having a beveled side surface formed with a partial bevel-edged blade in accordance with some embodiments of the present invention.
Figure 14B:
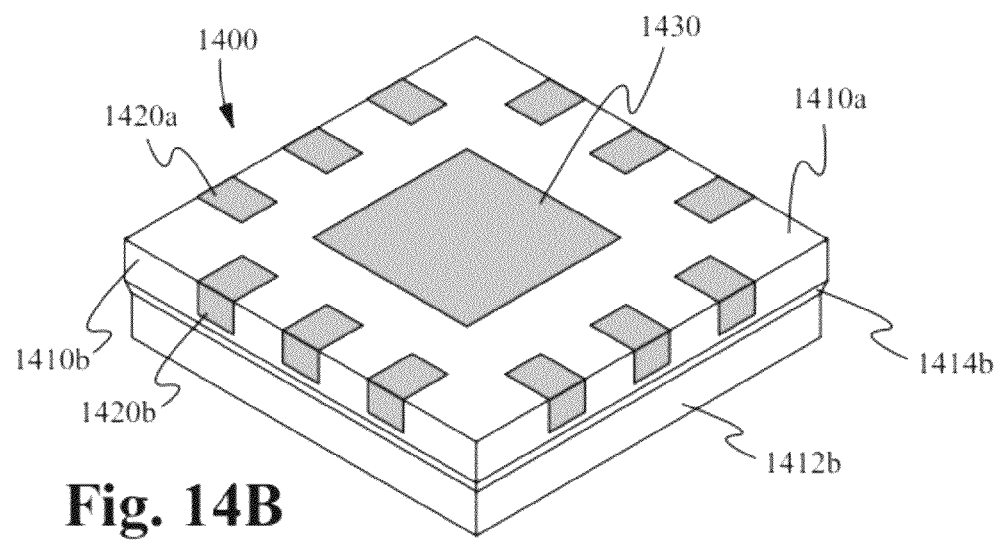
FIG. 14B is a perspective view of the top of the semiconductor package having a beveled side surface formed with a partial bevel-edged blade in accordance with some embodiments of the present invention.

FIGS. 14A and 14B illustrate perspective views of the bottom and top of a semiconductor package 1400 having a beveled side surface formed with a partial bevel-edged blade in accordance with some embodiments of the present invention. Semiconductor package 1400 is almost identical to semiconductor package 900, except that semiconductor package 1400 has a beveled side surface 1414b. Semiconductor package 1400 has a top surface 1410a, a bottom surface 1410c opposite the top surface 1410a, and side surfaces between top surface 1410a and bottom surface 1410c, preferably all formed by a molding compound. A leadframe is encased in the molding compound, with the top surfaces 1420a and side surfaces 1420b of its leads being exposed. In some embodiments, the leads are copper. However, it is contemplated that other materials besides copper can be used to form the leads. In some embodiments, the region 1430 of the leadframe corresponding to the die attach pad of the leadframe is also exposed. The top surfaces 1420a, side surfaces 1420b, and region 1430 are plated with a plating material. In some embodiments, the plating material on the surfaces is a material configured not to react with oxygen. In some embodiments, the plating material is a metallic material. In some embodiments, the plating material is tin. Other materials that can be used as the plating material include, but are not limited to, silver, gold, nickel-gold, nickel-palladium, and nickel-palladium-gold.

In some embodiments, the side surfaces of the semiconductor package 1400 have a first portion 1410b, formed from a first partial singulation blade, and a second portion 1412b, formed from a second partial singulation blade that is thicker than the first partial singulation blade. Additionally, the second partial singulation blade is a partially bevel-edged blade, such as blade 1362a in FIG. 13. As a result of the second singulation blade using a partially bevel-edged blade, a beveled side surface 1414b is formed on the side of the semiconductor package 1400 between the first portion 1410b and the second portion 1412b, which are non-beveled.

Figure 15A:
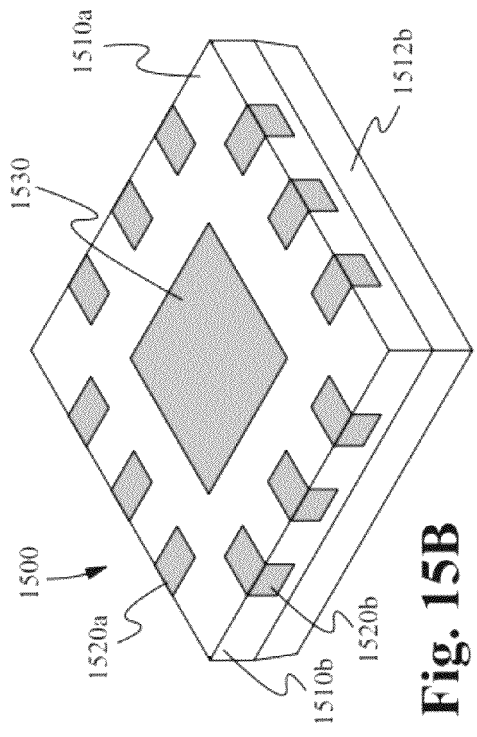
FIG. 15A is a perspective view of the bottom of a semiconductor package having a beveled side surface with a first height formed with a full bevel-edged blade in accordance with some embodiments of the present invention.
Figure 15B:
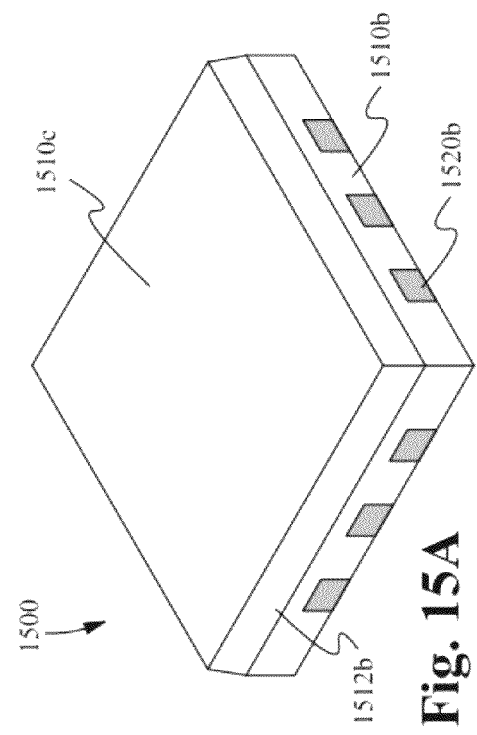
FIG. 15B is a perspective view of the top of the semiconductor package having a beveled side surface with a first height formed with a full bevel-edged blade in accordance with some embodiments of the present invention.

FIGS. 15A and 15B illustrate perspective views of the bottom and top of a semiconductor package 1500 having a beveled side surface with a first height formed with a full bevel-edged blade in accordance with some embodiments of the present invention. Semiconductor package 1500 is almost identical to semiconductor package 900, except that semiconductor package 1500 has a beveled side surface 1512b. Semiconductor package 1500 has a top surface 1512a, a bottom surface 1510c opposite the top surface 1510a, and side surfaces between top surface 1510a and bottom surface 1510c, preferably all formed by a molding compound. A leadframe is encased in the molding compound, with the top surfaces 1520a and side surfaces 1520b of its leads being exposed. In some embodiments, the leads are copper. However, it is contemplated that other materials besides copper can be used to form the leads. In some embodiments, the region 1530 of the leadframe corresponding to the die attach pad of the leadframe is also exposed. The top surfaces 1520a, side surfaces 1520b, and region 1530 are plated with a plating material. In some embodiments, the plating material on the surfaces is a material configured not to react with oxygen. In some embodiments, the plating material is a metallic material. In some embodiments, the plating material is tin. Other materials that can be used as the plating material include, but are not limited to, silver, gold, nickel-gold, nickel-palladium, and nickel-palladium-gold.

In some embodiments, the side surfaces of the semiconductor package 1500 have a first portion 1510b, formed from a first partial singulation blade, and a second portion 1512b, formed from a second partial singulation blade. The first portion 1510b is non-beveled. The second partial singulation blade is a full bevel-edged blade, such as blade 1362b in FIG.

13. As a result of the second singulation blade using a full bevel-edged blade, a beveled side surface 1512b is formed on the side of the semiconductor package 1500.

Figure 16A:
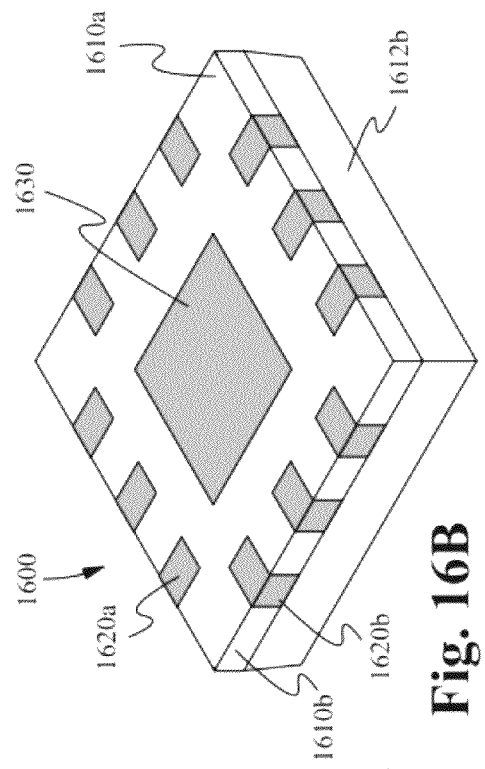
FIG. 16A is a perspective view of the bottom of a semiconductor package having a beveled side surface with a second height formed with a full bevel-edged blade in accordance with some embodiments of the present invention.
Figure 16B:
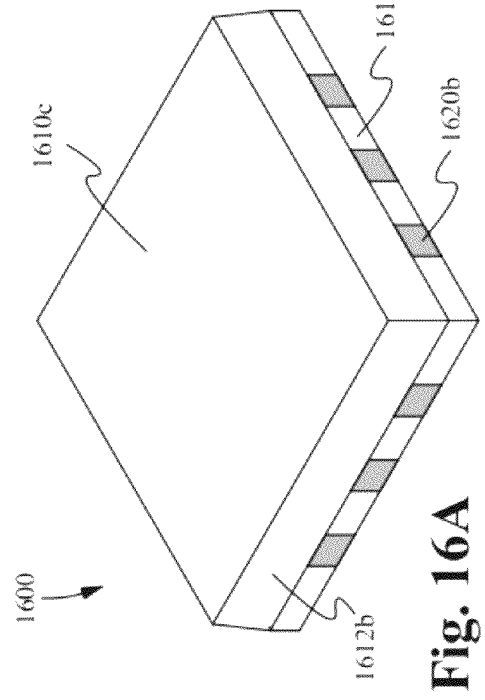
FIG. 16B is a perspective view of the top of the semiconductor package having a beveled side surface with a second height formed with a full bevel-edged blade in accordance with some embodiments of the present invention.

FIGS. 16A and 16B illustrate perspective views of the bottom and top of a semiconductor package 1600 having a beveled side surface with a second height formed with a full bevel-edged blade in accordance with some embodiments of the present invention. Semiconductor package 1600 is almost identical to semiconductor package 1500, except for the height of the beveled portion of its side surface. Semiconductor package 1600 has a top surface 1610a, a bottom surface 1610c opposite the top surface 1610a, and side surfaces between top surface 1610a and bottom surface 1610c, preferably all formed by a molding compound. A leadframe is encased in the molding compound, with the top surfaces 1620a and side surfaces 1620b of its leads being exposed. In some embodiments, the leads are copper. However, it is contemplated that other materials besides copper can be used to form the leads. In some embodiments, the region 1630 of the leadframe corresponding to the die attach pad of the leadframe is also exposed. The top surfaces 1620a, side surfaces 1620b, and region 1630 are plated with a plating material. In some embodiments, the plating material on the surfaces is a material configured not to react with oxygen. In some embodiments, the plating material is a metallic material. In some embodiments, the plating material is tin. Other materials that can be used as the plating material include, but are not limited to, silver, gold, nickel-gold, nickel-palladium, and nickel-palladium-gold.

In some embodiments, the side surfaces of the semiconductor package 1600 have a first portion 1610b, formed from a first partial singulation blade, and a second portion 1612b, formed from a second partial singulation blade. The first portion 1610b is non-beveled. The second partial singulation blade is a full bevel-edged blade, such as blade 1362b in FIG. 13. As a result of the second singulation blade using a full bevel-edged blade, a beveled side surface 1612b is formed on the side of the semiconductor package 1600.

As mentioned above, semiconductor package 1600 is almost identical to semiconductor package 1500, except for the height of the beveled side surface. The first portion 1510b and the beveled portion 1512b of the side surfaces in FIGS. 15A-B are substantially equal in height, whereas the first portion 1610b of the side surface in FIGS. 16A-B is substantially smaller in height than the second portion 1612b of the side surfaces in FIGS. 16A-B.

The variations in cutting shapes and heights discussed above and shown in the figures can be achieved by varying the shape of the cutting blade and its cutting depth.

The present invention has been described in terms of specific embodiments incorporating details to facilitate the understanding of principles of construction and operation of the invention. Such reference herein to specific embodiments and details thereof is not intended to limit the scope of the claims appended hereto. It will be readily apparent to one skilled in the art that other various modifications may be made in the embodiment chosen for illustration without departing from the spirit and scope of the invention as defined by the claims.

What is claimed is:

1. A leadframe strip comprising a plurality of non-singulated encapsulated semiconductor devices, wherein each of the semiconductor devices comprises:
    a portion of the leadframe strip having a die attach pad and a plurality of leads;
    a semiconductor die coupled to the die attach pad of the portion of the leadframe strip;
    a mold compound at least partially encasing the portion of the leadframe strip and the semiconductor die; and
    at least one partial cut that extends from the leadframe strip towards the mold compound, wherein the at least one partial cut partially separates a corresponding semiconductor device of the semiconductor devices from another semiconductor device of the semiconductor devices, and wherein side surfaces of the corresponding and the another semiconductor devices that are located at the at least one partial cut are plated with a plating material, wherein the plated side surfaces include side surfaces of the leads between the corresponding and the another semiconductor devices, the plating material being a different material than the leads.

2. The leadframe strip of claim 1, wherein the leads are copper.

3. The leadframe strip of claim 1, wherein the plating material is a metallic material.

4. The leadframe strip of claim 3, wherein the plating material is tin, silver, gold, nickel-gold, nickel-palladium, or nickel-palladium-gold.

5. The leadframe strip of claim 1, wherein the mold compound comprises a top surface, a bottom surface, and side surfaces between the top surface and the bottom surface, wherein the side surfaces comprises a step after full singulation separating the corresponding semiconductor device from the another semiconductor device.

6. The leadframe strip of claim 5, wherein the step defines a first portion of the side surfaces and a second portion of the side surfaces.

7. The leadframe strip of claim 6, wherein the first portion of the side surfaces and the second portion of the side surfaces are substantially equal in height.

8. The leadframe strip of claim 6, wherein the first portion of the side surfaces and the second portion of the side surfaces are different in height.

9. The leadframe strip of claim 6, wherein the plurality of leads is in the wider of the first portion of the side surfaces and the second portion of the side surfaces.

10. The leadframe strip of claim 1, wherein the mold compound comprises a top surface, a bottom surface, and side surfaces between the top surface and the bottom surface, wherein the side surfaces comprises a beveled portion after full singulation separating the corresponding semiconductor device from the another semiconductor device.

11. The leadframe strip of claim 1, wherein the mold compound comprises a top surface, a bottom surface, and side surfaces between the top surface and the bottom surface, wherein the side surfaces comprise a beveled portion and a non-beveled portion after full singulation separating the corresponding semiconductor device from the another semiconductor device.

12. The leadframe strip of claim 11, wherein the plurality of leads is in the beveled portion.

13. The leadframe strip of claim 11, wherein the plurality of leads is in the non-beveled portion.

14. The leadframe strip of claim 11, wherein the beveled portion is between a first section of the non-beveled portion and a second section of the non-beveled portion.

15. The leadframe strip of claim 14, wherein the plurality of leads is in the wider of the first section of the non-beveled portion and the second section of the non-beveled portion.

16. The leadframe strip of claim 1, wherein the semiconductor die is wire bonded to the leads of the leadframe.

17. The leadframe strip of claim 1, wherein the at least one partial cut extends beyond a height of the side surfaces of the leads.

18. The leadframe strip of claim 17, wherein the side surfaces of the leads are exposed starting at corners of the corresponding and the another non-singulated semiconductor devices.

19. A leadframe strip comprising a plurality of non-singulated encapsulated semiconductor devices, wherein each of the semiconductor devices comprises:
 a portion of the leadframe strip having a die attach pad and a plurality of leads;
 a semiconductor die coupled to the die attach pad of the portion of the leadframe strip;
 a mold compound at least partially encasing the portion of the leadframe strip and the semiconductor die; and
 at least one partial cut extending from the leadframe strip towards the mold compound, wherein the at least one partial cut electrically isolates a corresponding semiconductor device of the semiconductor devices from another semiconductor device of the semiconductor devices, and wherein side surfaces of the corresponding and the another semiconductor devices that are located at the at least one partial cut are plated with a plating material, wherein the plated side surfaces include side surfaces of the leads between the corresponding and the another semiconductor devices, the plating material being a different material than the leads, wherein the at least one partial cut is differently sized than at least one subsequent cut configured to singulate the corresponding semiconductor device from the another semiconductor device such that, when singulated from the another semiconductor device, the size of the area of a top surface of corresponding semiconductor device is different from the size of the area of a bottom surface of the corresponding semiconductor device.

* * * * *